United States Patent
Hodges

(10) Patent No.: US 9,647,162 B2
(45) Date of Patent: May 9, 2017

(54) ELECTRONIC POWER CELL MEMORY BACK-UP BATTERY

(71) Applicant: Colossus EPC Inc., Gilbert, AZ (US)

(72) Inventor: Michael Jon Hodges, Gilbert, AZ (US)

(73) Assignee: Colossus EPC Inc., Gilbert, AZ (US)

( * ) Notice: Subject to any disclaimer, the term of this patent is extended or adjusted under 35 U.S.C. 154(b) by 0 days.

(21) Appl. No.: 14/682,995

(22) Filed: Apr. 9, 2015

(65) Prior Publication Data
US 2015/0214414 A1 Jul. 30, 2015

Related U.S. Application Data

(63) Continuation-in-part of application No. 13/325,948, filed on Dec. 14, 2011, now abandoned.
(Continued)

(51) Int. Cl.
*H02S 99/00* (2014.01)
*H02S 10/40* (2014.01)
(Continued)

(52) U.S. Cl.
CPC ...... *H01L 31/055* (2013.01); *H01L 31/02021* (2013.01); *H01L 31/048* (2013.01);
(Continued)

(58) Field of Classification Search
CPC ........ G02B 2006/12157; G02B 6/2746; G02B 5/08–5/0875; G02F 1/0955
See application file for complete search history.

(56) References Cited

U.S. PATENT DOCUMENTS 2,259,372 A 10/1941 Geisler
2,531,000 A 11/1950 Scott
(Continued)

FOREIGN PATENT DOCUMENTS

ES 1072543 U 7/2010
JP 2004320976 A 11/2004
(Continued)

OTHER PUBLICATIONS

Machine translation of ES1072543U.
(Continued)

*Primary Examiner* — Eric R Smith
(74) *Attorney, Agent, or Firm* — Schmeiser, Olsen & Watts LLP

(57) ABSTRACT

An electronic power cell memory back-up battery is disclosed. The electronic power cell memory back-up battery utilizes stored light photons to produce usable energy, and can be used to replace batteries or other power sources in electronic devices. The electronic power cell memory back-up battery disclosed includes a light source and a photovoltaic device in optical communication with the light source. The photovoltaic device creates electrical power in response to receiving light from the light source. A portion of the electrical power generated by the photovoltaic device is used to power the light source. In some embodiments power input contacts are included for use in providing initial start-up power to the light source. In some embodiments the light source comprises a light-emitting device and a photoluminescent material optically coupled to the light-emitting device, where the photoluminescent material emits light in response to receiving light from the light-emitting device.

6 Claims, 26 Drawing Sheets

Related U.S. Application Data

(60) Provisional application No. 61/434,602, filed on Jan. 20, 2011.

(51) Int. Cl.

| | | |
|---|---|---|
| *H01L 31/055* | (2014.01) | |
| *H01L 31/02* | (2006.01) | |
| *H01L 31/048* | (2014.01) | |
| *G02F 1/095* | (2006.01) | |
| *G02B 5/08* | (2006.01) | |
| *G02B 6/27* | (2006.01) | |
| *F21S 9/03* | (2006.01) | |
| *H04B 10/80* | (2013.01) | |
| *G02B 6/12* | (2006.01) | |

(52) U.S. Cl.
CPC .............. *H02S 10/40* (2014.12); *H02S 99/00* (2013.01); *F21S 9/037* (2013.01); *G02B 5/0816* (2013.01); *G02B 6/2746* (2013.01); *G02B 2006/12157* (2013.01); *G02F 1/0955* (2013.01); *H04B 10/807* (2013.01); *Y02E 10/52* (2013.01); *Y10S 74/09* (2013.01)

(56) References Cited

U.S. PATENT DOCUMENTS

| | | | |
|---|---|---|---|
| 3,737,857 A * | 6/1973 | Carman | G08C 23/02 367/133 |
| 4,130,445 A | 12/1978 | Blieden | |
| 4,153,813 A | 5/1979 | Blieden et al. | |
| 4,155,371 A | 5/1979 | Wohlmut et al. | |
| 4,159,212 A | 6/1979 | Yerkes | |
| 4,173,495 A | 11/1979 | Rapp et al. | |
| 4,175,980 A | 11/1979 | Davis et al. | |
| 4,188,239 A | 2/1980 | Boling | |
| 4,190,465 A | 2/1980 | Boling | |
| 4,251,288 A | 2/1981 | Yerkes | |
| 4,268,709 A | 5/1981 | Boling | |
| 4,357,486 A | 11/1982 | Blieden et al. | |
| 4,628,143 A | 12/1986 | Brotz | |
| 4,713,493 A | 12/1987 | Ovshinsky | |
| 4,742,278 A * | 5/1988 | Iannini | H01J 17/38 315/227 R |
| 4,745,294 A | 5/1988 | Kohashi et al. | |
| 5,008,579 A | 4/1991 | Conley et al. | |
| 5,124,610 A | 6/1992 | Conley et al. | |
| 5,235,232 A | 8/1993 | Conley et al. | |
| 5,237,233 A * | 8/1993 | Conley | G21H 1/12 136/257 |
| 5,714,012 A | 2/1998 | Murata et al. | |
| 5,828,074 A | 10/1998 | Pearlman | |
| 6,452,088 B1 | 9/2002 | Schmidt | |
| 6,655,814 B1 | 12/2003 | Tagawa et al. | |
| 6,660,929 B2 | 12/2003 | Nelson | |
| 7,387,400 B2 | 6/2008 | Nakata et al. | |
| 7,541,537 B2 | 6/2009 | Madigan | |
| 2006/0152140 A1 | 7/2006 | Brandes | |
| 2006/0172148 A1 * | 8/2006 | Murayama | C09K 11/06 428/690 |
| 2007/0007844 A1 | 1/2007 | Barbat | |
| 2007/0018558 A1 | 1/2007 | Chua et al. | |
| 2007/0062572 A1 | 3/2007 | Judd et al. | |
| 2007/0199591 A1 | 8/2007 | Harder et al. | |
| 2007/0295383 A1 | 12/2007 | Li et al. | |
| 2008/0289678 A1 | 11/2008 | Rouda | |
| 2008/0302415 A1 | 12/2008 | Buller et al. | |
| 2008/0302418 A1 | 12/2008 | Buller et al. | |
| 2009/0044861 A1 | 2/2009 | Debije et al. | |
| 2009/0050201 A1 | 2/2009 | Fortmann | |
| 2009/0056791 A1 | 3/2009 | Pfenninger et al. | |
| 2009/0065040 A1 | 3/2009 | Tatarinov | |
| 2009/0095341 A1 | 4/2009 | Pfenninger et al. | |
| 2009/0151776 A1 | 6/2009 | Schindler | |
| 2009/0194160 A1 | 8/2009 | Chin et al. | |
| 2009/0211631 A1 | 8/2009 | Temchenko et al. | |
| 2009/0244488 A1 | 10/2009 | Tang | |
| 2009/0277494 A1 | 11/2009 | Mazzer et al. | |
| 2009/0308441 A1 | 12/2009 | Nayfeh et al. | |
| 2010/0000602 A1 | 1/2010 | Gray et al. | |
| 2010/0012167 A1 | 1/2010 | Milshtein et al. | |
| 2010/0018135 A1 | 1/2010 | Croft et al. | |
| 2010/0096000 A1 | 4/2010 | Andrade | |
| 2010/0116312 A1 | 5/2010 | Peumans et al. | |
| 2010/0132765 A1 | 6/2010 | Cumpston et al. | |
| 2010/0133987 A1 | 6/2010 | Huang et al. | |
| 2010/0139765 A1 | 6/2010 | Mapel | |
| 2010/0139769 A1 | 6/2010 | Mapel | |
| 2010/0147367 A1 | 6/2010 | Cumpston et al. | |
| 2010/0180932 A1 | 7/2010 | Wang et al. | |
| 2010/0180937 A1 | 7/2010 | Jain et al. | |
| 2010/0206355 A1 | 8/2010 | Johnson | |
| 2010/0224248 A1 | 9/2010 | Kenney et al. | |
| 2010/0229908 A1 | 9/2010 | Van Steenwyk et al. | |
| 2010/0236625 A1 | 9/2010 | Kenney et al. | |
| 2010/0243051 A1 | 9/2010 | Slager | |
| 2010/0243053 A1 | 9/2010 | Coe-Sullivan et al. | |
| 2010/0252090 A1 | 10/2010 | Milshtein et al. | |
| 2010/0281721 A1 | 11/2010 | Chen et al. | |
| 2010/0283266 A1 | 11/2010 | Shafiq et al. | |
| 2010/0288333 A1 | 11/2010 | Temchenko et al. | |
| 2011/0017255 A1 * | 1/2011 | Fuller | H02S 99/00 136/244 |
| 2011/0284053 A1 * | 11/2011 | Brewer | H01L 25/167 136/246 |
| 2012/0186627 A1 * | 7/2012 | Hodges | H02S 99/00 136/246 |
| 2012/0187763 A1 * | 7/2012 | Hodges | H02S 99/00 307/43 |

FOREIGN PATENT DOCUMENTS

| | | |
|---|---|---|
| WO | 2008018672 A1 | 2/2008 |
| WO | 2010102408 A1 | 9/2010 |

OTHER PUBLICATIONS

Machine translation of JP2004-320976A.
C. Honsberg and S. Bowden, "Quantum Efficiency", [retrieved from internet at http://www.pveducation.org/pvcdrom/solar-cell-operation/quantum-efficiency on Sep. 8, 2014].

* cited by examiner

ELECTRONIC POWER CELL MEMORY BACK-UP BATTERY

CROSS REFERENCE TO RELATED APPLICATIONS

This application claims priority to U.S. patent application Ser. No. 13/325,948, filed Dec. 14, 2011, and to U.S. Provisional Patent Application to Michael Jon Hodges entitled "Electronic Power Source," Ser. No. 61/434,602 filed Jan. 20, 2011, the disclosures of which are hereby incorporated entirely herein by reference.

BACKGROUND OF THE INVENTION

Technical Field

This invention relates generally to power sources and in particular to an electronic power generator that can be used to replace batteries in electronic devices.

State of the Art

Power sources are in constant demand in society today. We need power to run our homes, businesses, and our electronic devices. When a system or device is not connected to the power grid, where power is delivered to home and businesses through electrical lines and outlets, it must be powered by its own power source. Automobiles, for instance, are powered by combustion engine power generators, which generate power by converting fuel into mechanical motion. Electrical power generators are another option for generating power. Electrical power generators are often used to convert fuel into electricity. Chemical batteries are power sources which store power chemically, convert the chemical energy into electrical power, and deliver electricity on demand. Chemical batteries are used to provide the starting electricity for fuel engines such as those used in automobiles and power generators. Chemical batteries are also commonly used to power portable electronic devices such as mobile phones, toys, video games, and other portable communication and amusement devices, tools, and portable appliances.

Chemical storage batteries have provided a convenient and portable source of electrical power for electronic devices for many years. But the demand on battery technology is severe in terms of efficiency, lifetime, and environmental requirements. Products such as laptops, communication devices, and automobiles require higher levels of power in smaller packages. In addition, chemical battery technology is not environmentally friendly. Chemical batteries store energy using chemicals and materials which are environmentally hazardous. When improperly disposed of, the harmful substances in batteries, including mercury, lead, cadmium, and nickel can contaminate the environment. When incinerated, chemical batteries produce toxic ash which pollutes our air and atmosphere. And as it rusts, the metal in chemical batteries can release harmful metal components that are absorbed into the earth and can contaminate our drinking water. The storage and disposal of batteries and their components is becoming an issue as we become more conscious and restrictive on what we are putting into our garbage dumps. It is therefore desirable to have a power source suitable for providing electrical power that uses materials which can be easily disposed of and recycled. It is also desirable to have a portable electrical power source which can provide high levels of electrical power output in a small form factor. Accordingly, a power source is disclosed which can be used to provide efficient and portable electrical power using environmentally friendly materials.

DISCLOSURE OF THE INVENTION

The disclosed invention relates to power sources and in particular to an electronic power source that can be used to replace batteries in electronic devices.

Disclosed is a power source comprising a light source and a photovoltaic device. The light source emits light in response to receiving light source input power. The photovoltaic device outputs photovoltaic-generated electrical power in response to receiving light from the light source. A first portion of the photovoltaic-generated electrical power output by the photovoltaic device is the light source input power. In some embodiments the light source comprises a light-emitting device and a photoluminescent material. The light-emitting device emits light of a first peak wavelength in response to receiving the light source input power. The photoluminescent material emits light of a second peak wavelength in response to receiving light of the first peak wavelength from the light-emitting device. In some embodiments the light source receives temporary light source input power from an external power supply during startup of the power source, but receives no other externally-supplied power.

In some embodiments the power source includes a block of optical coupling material, where the light-emitting device and the photoluminescent material are embedded in the block of optical coupling material. In some embodiments the photovoltaic device is embedded in the block of optical coupling material. In some embodiments the light source comprises a light-emitting device, a first photoluminescent material, and a second photoluminescent material. The light-emitting device emits light of a first peak wavelength in response to receiving the light source input power. The first photoluminescent material emits light of a second peak wavelength in response to receiving light of a first peak wavelength from the light-emitting device. The second photoluminescent material emits light of a third peak wavelength in response to receiving light of a first peak wavelength from the light-emitting device. In some embodiments the photovoltaic device comprises the light source.

A power source is disclosed that includes a plurality of alternating layers of a photovoltaic device and a light source. A first subset of the plurality of photovoltaic device layers outputs a first portion of photovoltaic-generated electrical power in response to receiving light from one or more than one of the plurality of light source layers. A second subset of the plurality of photovoltaic device layers outputs a second portion of photovoltaic-generated electrical power in response to receiving light from one or more than one of the plurality of light source layers. The first portion of photovoltaic-generated electrical power is provided to the plurality of light source layers as light source input power. The second portion of photovoltaic-generated electrical power is provided as power source output power. Each of the plurality of light source layers emits light in response to receiving the light source input power. In some embodiments the power source receives no externally-supplied input power except for a temporary light source input power received during initial start-up of the power source.

In some embodiments the power source includes a power distribution circuit, where the power distribution circuit includes a light source power conditioning circuit and a power output circuit. The light source power conditioning circuit outputs the light source input power in response to receiving the first portion of photovoltaic-generated electrical power from the first subset of the plurality of photovoltaic device layers. The power output circuit provides the power source output power in response to receiving the second subset of photovoltaic-generated electrical power from the second subset of the plurality of photovoltaic device layers. In some embodiments each of the plurality of light source layers includes a light-emitting device and a photoluminescent material. The light-emitting device emits light of a first wavelength in response to receiving light source input power. The photoluminescent material emits light of a second peak wavelength in response to receiving light of the first peak wavelength from the light-emitting device. In some embodiments the power source includes a block of optical coupling material, where the plurality of alternating layers of the photovoltaic device layer and the light source layer are embedded in the block of optical coupling material.

Disclosed is a method of generating electrical power with a power source which includes the step of forming an electricity generation module. The electricity generation module includes a photoluminescent light source, where the photoluminescent light source emits light in response to receiving light source input power. The electricity generation module includes a top photovoltaic device, where the top photovoltaic device outputs top photovoltaic-generated electrical power in response to receiving light from the photoluminescent light source. The electricity generation module includes a bottom photovoltaic device, where the bottom photovoltaic device outputs bottom photovoltaic-generated electrical power in response to receiving light from the photoluminescent light source. The method of generating electrical power from a power source also includes the step of conducting the top photovoltaic-generated electrical power to the light source as light source input power. The method of generating electrical power with a power source also includes the step of providing the bottom photovoltaic-generated electrical power as the power source output power.

In some embodiments the step of forming an electricity generation module includes the step of forming a photoluminescent light source. In some embodiments the step of forming a photoluminescent light source includes embedding a light-emitting device and a photoluminescent material in a block of optical coupling material. In some embodiments forming a photoluminescent light source further includes embedding the top photovoltaic device and the bottom photovoltaic device in the block of optical coupling material.

In some embodiments the step of conducting the top photovoltaic-generated electrical power to the light source as light source input power includes the step of conducting the top photovoltaic-generated electrical power to a light source power collection circuit, where the light source power collection circuit outputs collected light source power in response to receiving the top photovoltaic-generated electrical power. In some embodiments the step of conducting the top photovoltaic-generated electrical power to the light source as light source input power includes the step of conducting the collected light source power to a light source power distribution circuit, where the light source power distribution circuit outputs the light source input power in response to receiving the collected light source power. In some embodiments the step of providing the bottom photovoltaic-generated electrical power as the power source output power includes conducting the bottom photovoltaic-generated electrical power to a power output circuit, where the power output circuit outputs the power source output power in response to receiving the bottom photovoltaic-generated electrical power.

Disclosed is a power source comprising a light source and a photovoltaic layer in optical communication with the light source. The light source creates light in response to receiving electrical power. The photovoltaic layer creates electrical power in response to receiving light from the light source. A portion of the electrical power generated by the photovoltaic layer is used to power the light source. In some embodiments power input contacts are included for use in providing initial start-up power to the light source. In some embodiments the light source comprises a light-emitting device and a photoluminescent material optically coupled to the light-emitting device, where the photoluminescent material emits light in response to receiving light from the light-emitting device. In some embodiments the light source is a photoluminescent light source which includes a photoluminescent material embedded in an optical coupling material. In some embodiments the photoluminescent light source comprises a top surface, a bottom surface, and at least one edge. In some embodiments the light-emitting device is optically coupled to the at least one edge. In some embodiments a top photovoltaic layer is positioned in optical communication with the top surface of the photoluminescent light source, where the top photovoltaic layer creates electrical power in response to receiving light from the photoluminescent light source. In some embodiments a bottom photovoltaic layer is positioned in optical communication with the bottom surface of the photoluminescent light source, where the bottom photovoltaic layer creates electrical power in response to receiving light from the photoluminescent layer.

Disclosed is a power source comprising a set of alternating layers of photoluminescent material and photovoltaic material. Each layer of photoluminescent material is optically coupled to a light-emitting device, where the photoluminescent material emits light in response to receiving light from the light-emitting device. The layers of photovoltaic material create electrical power in response to receiving light from the photoluminescent material. A portion of the electrical power created by the layers of photovoltaic material is used to power the light-emitting device. In some embodiments the layer of photoluminescent material includes a photoluminescent material embedded in an optical coupling material. In some embodiments the light-emitting device is embedded in the optical coupling material. In some embodiments the set of alternating layers of photovoltaic material and photoluminescent material are all embedded in the optical coupling material.

Disclosed is a method of generating electrical power comprising the steps of obtaining a photoluminescent light source, optically coupling a photovoltaic layer to the light source, applying a starting power to the light source, collecting electrical power from the photovoltaic layer, and routing a portion of the electrical power collected from the photovoltaic layer to power the photoluminescent light source. In some embodiments building a photoluminescent light source includes embedding a light-emitting device into an optical coupling material. In some embodiments building a photoluminescent light source includes embedding a photoluminescent material into the optical coupling material. In some embodiments other steps are included.

Disclosed is an electronic power cell memory back-up battery comprising a set of alternating layers of photoluminescent material and photovoltaic material. The photoluminescent material comprises Light Photon Releaser (LPR), which comprises an optical compound doped with phosphorous, Europium, and various earth elements, such as, for example, elements from the Lanthanide series. The LPR stores light photons that are subsequently released by light emitted from a light-emitting device. Each layer of photoluminescent material is optically coupled to a light-emitting device, where the photoluminescent material emits light, comprising light photons stored in the LPR, in response to receiving light from the light-emitting device. The electronic power cell memory back-up battery further comprises mirrors coated with the LPR for releasing additional photons in response to light received from the light-emitting device. The layers of photovoltaic material create electrical power in response to receiving light from the photoluminescent material. A portion of the electrical power created by the layers of photovoltaic material is provided to power modulating circuitry which provides a periodic power supply signal to the light-emitting device that is used to power the light-emitting device. In some embodiments the layer of photoluminescent material includes a photoluminescent material embedded in an optical coupling material. In some embodiments the light-emitting device is embedded in the optical coupling material. In some embodiments the set of alternating layers of photovoltaic material and photoluminescent material are all embedded in the optical coupling material. In some embodiments, external surfaces of the electronic power cell memory back-up battery are coated with a reflective coating to prevent light and/or photons from exiting the electronic power cell memory back-up battery.

Disclosed is an electronic power cell memory back-up battery method of generating electrical power comprising the steps of obtaining a photoluminescent light source comprising Light Photon Releaser (LPR) and mirrors comprising LPR, optically coupling a photovoltaic layer to the light source, applying a starting power to the light source, collecting electrical power from the photovoltaic layer, routing a portion of the electrical power collected from the photovoltaic layer to power modulating circuitry to provide a periodic power supply signal, and providing the periodic power supply signal to the photoluminescent light source to power the photoluminescent light source. In some embodiments building a photoluminescent light source includes embedding a light-emitting device into an optical coupling material. In some embodiments building a photoluminescent light source includes embedding a photoluminescent material into the optical coupling material. In some embodiments other steps are included.

Electronic Power Cell Memory Back-Up Battery

The foregoing and other features and advantages of the present invention will be apparent from the following more detailed description of the particular embodiments of the invention, as illustrated in the accompanying drawings.

DETAILED DESCRIPTION OF EMBODIMENTS OF THE INVENTION

As discussed above, embodiments of this invention relate to an electrical power source that can be used to replace batteries in electronic devices. In the United States alone we dispose of millions of batteries every year. The number of devices using batteries for power is increasing. We are becoming more aware of the damage that can be done to our environment through improper storage and disposal of traditional chemical storage batteries, and yet we continue to create battery-powered devices which require ever-higher levels of electrical energy. Portable communication and computing devices, for example, continue to expand their capabilities, but also continue to demand higher levels of electrical power for operation. There is a strong demand for portable power sources which can provide electrical power in a small package and with environmentally-friendly materials.

Figure 1:
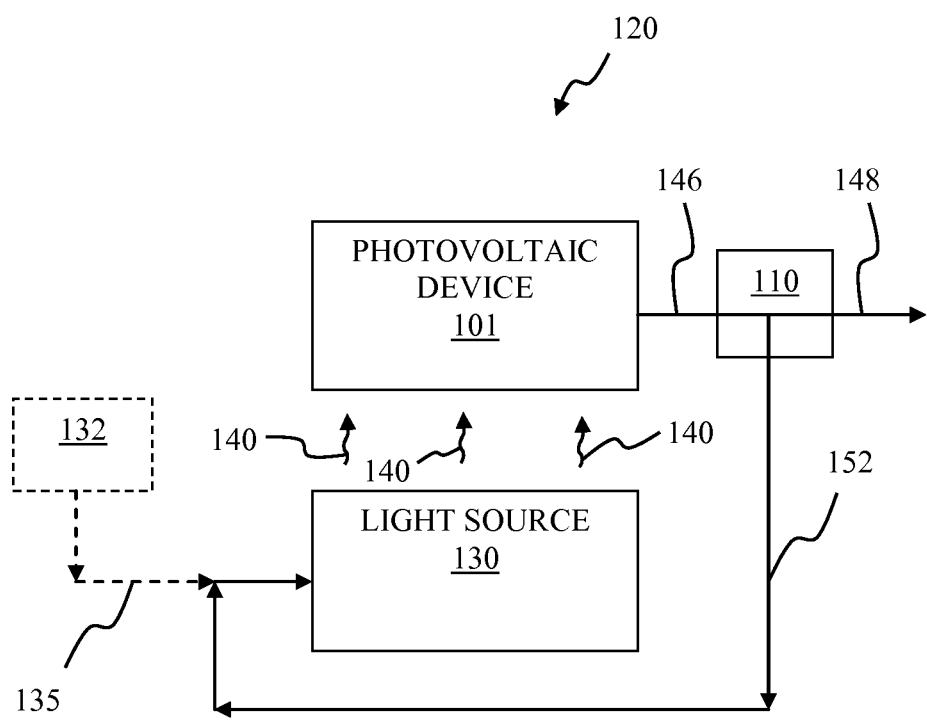
FIG. 1 shows a block diagram of an embodiment of power source 120 according to the invention.

FIG. 1 shows a block diagram of an embodiment of power source 120 according to the invention. Power source 120 outputs power source output power 148 which is usable electrical power. Power source 120 according to the invention generates power source output power 148. Power source output power 148 is useable electrical power that can be used to power laptop computers, cellphones, toys, cameras, flashlights, smoke alarms, remote control devices, portable generators, appliances, consumer items, and other devices which require electrical power to operate. Power source 120 can be used to provide starting power for automobiles and electrical generators. Power source 120 is envisioned for use in providing electrical power 148 for electric vehicles as well as small power-generating stations for providing household and commercial power. Power source 120 does not store energy as in typical chemical storage batteries, but instead generates electrical power in the form of power source output power 148 once power source 120 is started, or activated, by a temporary external power supply. Once activated, power source 120 generates electrical power 148 continually until turned off, and does not need recharging or replacement. Power source 120 has a useful life which lasts as long as the electrical and optical components which make up power source 120 continue to operate. Once the useful life of power source 120 is over, power source 120 can be recycled or disposed of without leaving harmful by-products.

Power source 120 as shown in FIG. 1 includes light source 130 and photovoltaic device 101. Light source 130 emits light 140 in response to receiving light source input power 152. Photovoltaic device 101 outputs photovoltaic-generated electrical power 146 in response to receiving light 140 from light source 130. Photovoltaic-generated electrical power 146 is divided up into a first portion of photovoltaic-generated electrical power 152 and a second portion of photovoltaic-generated electrical power 148. In the embodiment shown in FIG. 1, first portion of photovoltaic-generated electrical power 152 is light source input power 152. First portion of photovoltaic-generated electrical power 152 is conducted to light source 130 and used to power light source 130. Second portion of photovoltaic-generated electrical power 148 is output from power source 120 as power source output power 148. Power source output power 148 is usable electrical power that can be used to power many different electrical devices as mentioned above. As shown in FIG. 1, during operation, photovoltaic device 101 generates enough photovoltaic-generated electrical power 146 to both power light source 130 and to provide usable power source output power 148.

Power source 120 as shown in FIG. 1 uses temporary power supply 132 to temporarily supply light source input power 152 at startup of power source 120. When power source 120 is inactive, or in the "off" state, light source 130 is not generating light 140, and power source 120 is not outputting output power 148. In order to activate power source 120, or start its generation of output power 148, light source 130 needs to be supplied with a temporary supply of light source input power 152. Temporary power supply 132 is used in this embodiment to supply temporary light source input power 135, which is used temporarily as light source input power 152. Light source 130 will begin to emit light 140 upon receipt of light source input power 152. Photovoltaic device 101 begins to generate photovoltaic-generated electrical power 146 upon receipt of light 140 from light source 130. Photovoltaic-generated electrical power is then divided, by power distribution circuit 110, into light source input power 152 and output power 148. Temporary power supply 132 can then be disconnected as it is no longer needed. Power source 120 will continue to generate enough photovoltaic-generated electrical power to supply light source 130 with light source input power 152 and provide output power 148 for powering electrical devices external to power source 120. Temporary power supply 132 and temporary light source input power 135 are shown in FIG. 1 in dotted lines to indicate that they are not part of power source 120 and that they are temporarily used to activate power source 120. In this embodiment temporary power supply 132 provides approximately one second of temporary light source input power 135 to activate power source 120, after which temporary power supply 132 is disconnected from power source 120. Power source 120 does not need, use, or receive any other externally-supplied power except for temporary light source input power 135.

Photovoltaic device 101 according to the invention can be many different types of devices, layers, materials, or elements that generate electricity in response to receiving light. Photovoltaic device 101 of FIG. 1 can be any of the types of photovoltaic devices that are discussed in this document, or another type of photovoltaic device. In some embodiments of power source 120, photovoltaic device 101 includes light source 130. In the embodiment in which photovoltaic device 101 includes light source 130, photovoltaic device 101 is a semiconductor device which includes light-emitting elements or materials, as will be discussed in more detail shortly.

Light source 130 according to the invention can be many different types of light sources, some of which will be discussed in more detail in this document. In some embodiments light source 130 is a photoluminescent light source, meaning light source 130 includes an element that emits light in response to receiving light. In some embodiments, light source 130 is a combination photoluminescent/electroluminescent light source. Light source 130 of FIG. 1 can be any of the different types of light sources discussed in this document, or any other type of light source which emits light in response to receiving light source input power. Light source 130 can be any of the types of light sources 130 shown in FIG. 6 through FIG. 9, for example, but not by way of limitation.

Power distribution circuit 110 can take many different forms, some of which will be discussed in more detail in this document. In the embodiment shown in FIG. 1, power distribution circuit 110 is a splitter device, which splits photovoltaic-generated electrical power 146 into two separate outputs, output power 148, and light source input power 152. Output power 148 and light source input power 152 can be the same amount of power or different amounts of power. Power distribution circuit 110 can be or include many different types of components, circuits, and devices. Power distribution circuit 110 of FIG. 1 can be any of the types or forms of power distribution circuits discussed in this document or other types of power distribution circuit 110.

Figure 2:
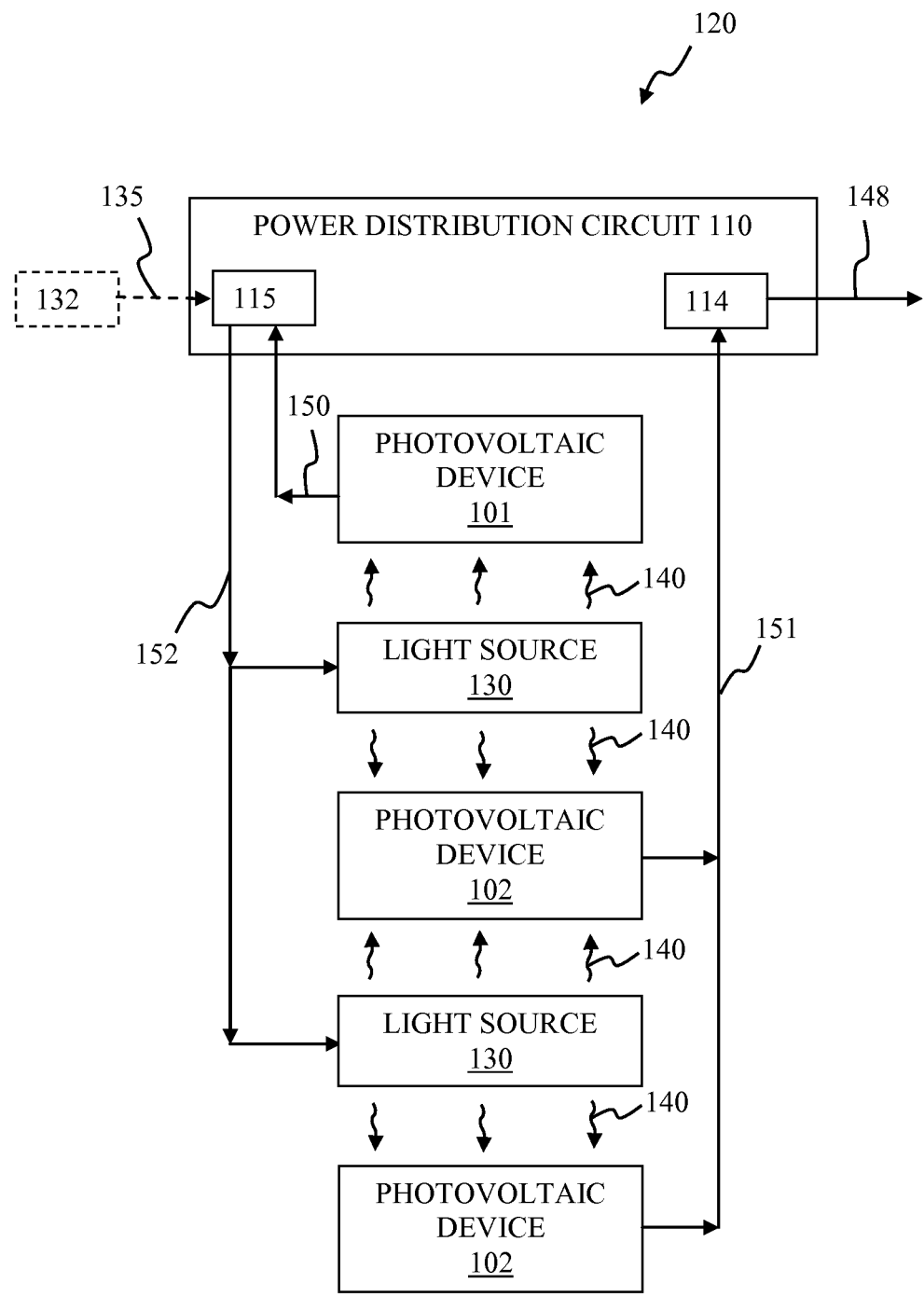
FIG. 2 shows a block diagram of an embodiment of power source 120 according to the invention.

FIG. 2 shows an embodiment of power source 120 in which power source 120 includes a plurality of alternating layers of a photovoltaic device and a light source. In this embodiment the plurality of layers of a photovoltaic device includes photovoltaic devices 101 and 102. In this embodiment the plurality of layers of a light source includes light sources 130. Each of the plurality of photovoltaic device layers 101 or 102 emits photovoltaic-generated electrical power in response to receiving light 140 from one or more than one of the plurality of light source layers 130. Each of the plurality of light source layers 130 emits light 140 in response to receiving light source input power 152. In power source 120 of FIG. 2, the plurality of photovoltaic device layers includes a first subset of photovoltaic device layers represented by photovoltaic device 101, as shown in FIG. 2, and a second subset of photovoltaic device layers, represented by photovoltaic devices 102, as shown in FIG. 2.

The first subset of the plurality of photovoltaic device 101 and 102 layers, represented by photovoltaic device 101, outputs first portion of photovoltaic-generated electrical power 150 in response to receiving light 140 from one or more than one of the plurality of light source 130 layers. First portion of photovoltaic-generated electrical power 150 is provided to the plurality of light source layers 130 as light source input power 152. The first subset of the plurality of photovoltaic device 101 and 102 layers is shown as one photovoltaic device 101 in FIG. 2, but it is to be understood that the first subset of photovoltaic devices 101 layers can be one or more than one photovoltaic device 101, or one or more than one photovoltaic device 102, or a combination of one or more than one photovoltaic device 101 and 102, according to the particular design of power source 120.

The second subset of the plurality of photovoltaic device 101 and 102 layers, represented by photovoltaic devices 102, outputs second portion of photovoltaic-generated electrical power 151 in response to receiving light 140 from one or more than one of the plurality of light source 130 layers. Second portion of photovoltaic-generated electrical power 151 is provided as power source output power 148. Power source output power 148 is electrical power that is output from power source 120 and can be used to power devices, components, or any other thing that uses electrical power. The second subset of photovoltaic devices 102 is shown as two photovoltaic devices 102 in FIG. 2, but it is to be understood that the second subset of photovoltaic devices 102 can be one or more than one photovoltaic device 102, according to the particular design of power source 120. In some embodiments the second subset of photovoltaic devices 102 is one photovoltaic device 102. In some embodiments the second subset of photovoltaic devices 102 is more than two photovoltaic devices 102.

Power source 120 of FIG. 2 uses no externally-supplied input power except temporary light source input power 135 from temporary power supply 132, which is temporarily supplied to power source 120 to activate power source 120. Once power source 120 is activated and generating output power 148, temporary power supply 132 is disconnected and not needed any more. Power source 120 continues to supply output power 148 after temporary power supply 132 is disconnected. Power source 120 continues to supply output power 148 until power source 120 is turned off.

As shown in FIG. 2, first portion of photovoltaic-generated electrical power 150 is provided to the plurality of light source 130 layers as light source input power 152. First portion of photovoltaic-generated electrical power 150 is provided to the plurality of light source 130 layers as light source input power 152 through power distribution circuit 110. Power distribution circuit 110 in this embodiment includes light source power conditioning circuit 115, and power output circuit 114. Light source power conditioning circuit 115 outputs light source input power 152 in response to receiving first portion of photovoltaic-generated electrical power 150 from photovoltaic-device 101. Light source power conditioning circuit 115 can be many different types or forms of circuit elements or components which condition first portion of photovoltaic-generated electrical power 150 before sending power to light source 130 as light source input power 152. Light source power conditioning circuit 115 can convert, transform, split, regulate, or otherwise condition first portion of photovoltaic-generated electrical power 150 in any number of ways as is known in the art or to be discovered.

As shown in FIG. 2, second portion of photovoltaic-generated electrical power 151 is provided as power source output power 148. Second portion of photovoltaic-generated electrical power 151 is provided as power source output power 148 through power distribution circuit 110. Power distribution circuit 110 in this embodiment includes light source power conditioning circuit 115, and power output circuit 114. Power output circuit 114 outputs power source output power 148 in response to receiving second portion of photovoltaic-generated electrical power 151 from photovoltaic devices 102. Power output circuit 114 can be many different types or forms of circuit elements or components which condition second portion of photovoltaic-generated electrical power 151 before providing output power 148 to be used by external elements or components or devices. Power output circuit 114 can convert, transform, split, regulate, or otherwise condition second portion of photovoltaic-generated electrical power 151 in any number of ways as is known in the art or to be discovered.

Photovoltaic device 101 of FIG. 2 can be any of the types of photovoltaic devices that are discussed in this document, or another type of photovoltaic device. In some embodiments of power source 120, photovoltaic device 101 includes light source 130. In the embodiment in which photovoltaic device 101 includes light source 130, photovoltaic device 101 is a semiconductor device which includes light-emitting elements or materials, as will be discussed in more detail shortly.

Light source 130 of FIG. 2 can be many different types of light sources, some of which will be discussed in more detail later in this document. In some embodiments light source 130 is a photoluminescent light source, meaning light source 130 includes an element that emits light in response to receiving light. In some embodiments, light source 130 is a combination photoluminescent/electroluminescent light source, meaning light source 130 includes an element that emits light in response to receiving light, and an element that emits light in response to receiving electricity. Light source 130 of FIG. 2 can be any of the different types of light sources discussed in this document, or any other type of light source which emits light in response to receiving light source input power. Light source 130 of FIG. 2 can be any of the types of light sources 130 shown in FIG. 6 through FIG. 9, for example, but not by way of limitation.

Figure 3:
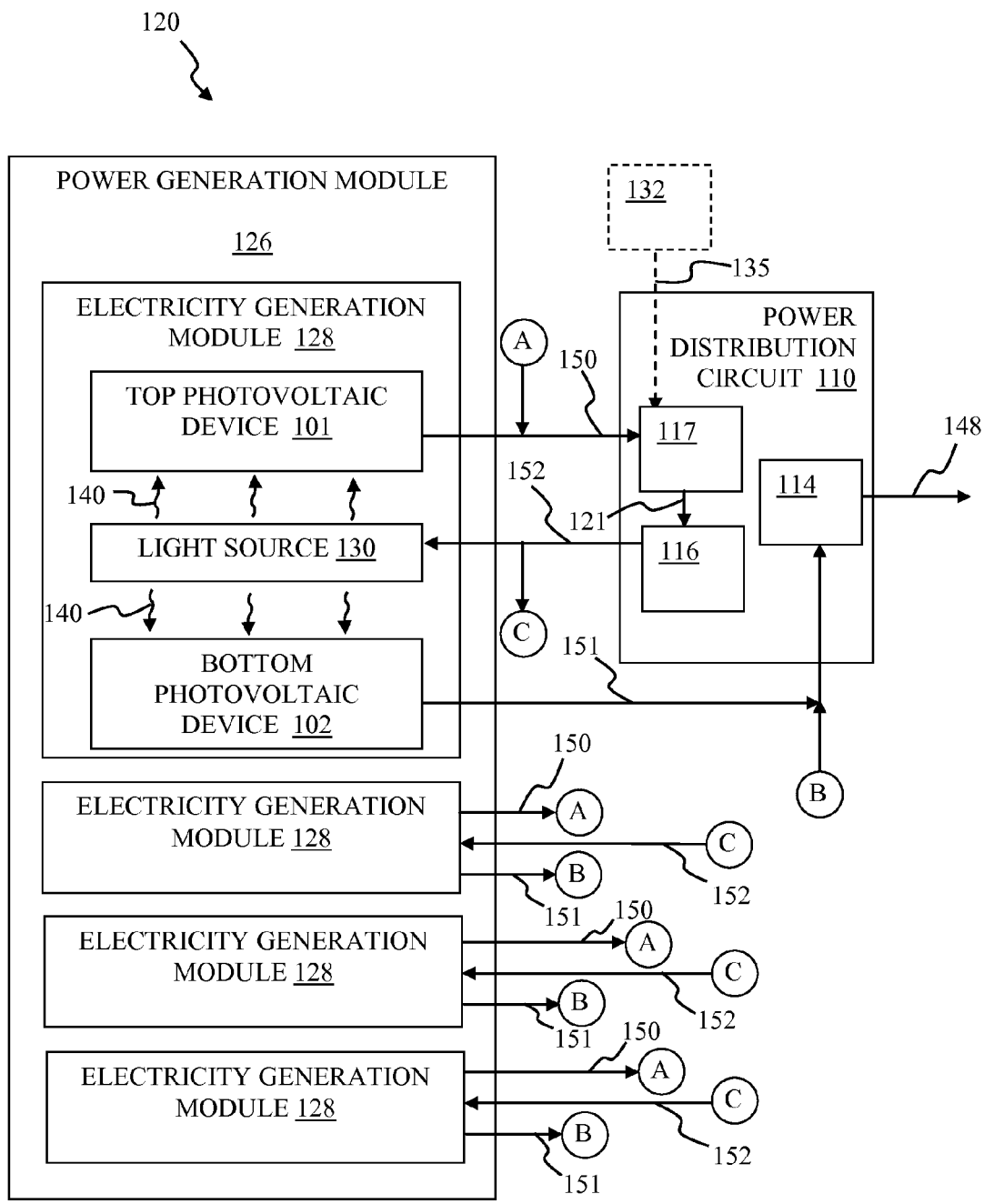
FIG. 3 shows a block diagram of an embodiment of power source 120 according to the invention.
Figure 4:
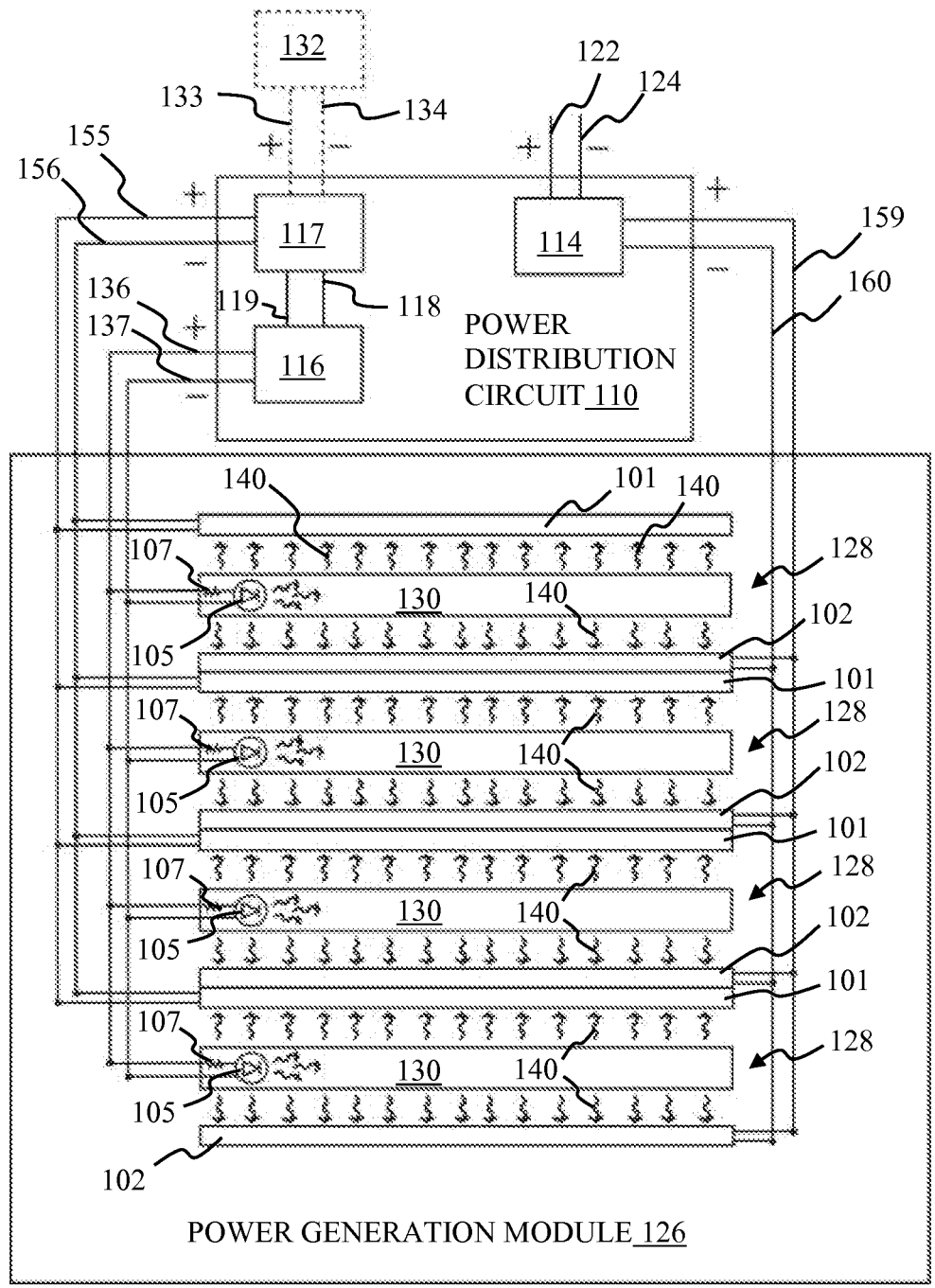
FIG. 4 shows a simplified schematic diagram of power source 120 of FIG. 3.

FIG. 3 shows a block diagram of a further embodiment of power source 120 according to the invention, and FIG. 4 shows a simplified schematic diagram of power source 120 of FIG. 3. Power source 120 as shown in FIG. 3 and FIG. 4 includes several electricity generation modules 128. Electricity generation module 128 includes light source 130. Light source 130 emits light 140 in response to receiving light source input power 152. Electricity generation module 128 includes top photovoltaic device 101. Top photovoltaic device 101 outputs top photovoltaic-generated electrical power 150 in response to receiving light 140 from light source 130. Electricity generation module 128 includes bottom photovoltaic device 102. Bottom photovoltaic device 102 outputs bottom photovoltaic-generated electrical power 151 in response to receiving light 140 from light source 130.

In some embodiments light source 130 is a photoluminescent light source, as will be discussed in more detail shortly.

Power source 120 as shown in FIG. 3 and FIG. 4 includes four electricity generation modules 128, which comprise power generation module 126. It is to be understood that power source 120 and power generation module 126 can include any number of electricity generation modules 128 according to design and the amount of power needed.

Electricity generation modules 128 generate top photovoltaic-generated electrical power 150 and bottom photovoltaic-generated electrical power 151, which are sent to power distribution circuit 110 as shown in FIG. 3 and FIG. 4.

Power distribution circuit 110 in the embodiment shown in FIG. 3 and FIG. 4 includes power output circuit 114, light source power collection circuit 117, and light source power distribution circuit 116. Light source power collection circuit 117 receives and collects power to be used to power light source 130. During startup (activation) of power source 120, light source power collection circuit 117 receives temporary light source input power 135, also referred to as starting power 135, from temporary power supply 132. Temporary power supply 132 is temporarily connected to power source 120 using power input contacts 133 and 134 to provide initial starting power to light source 130 and begin the power generation process of power source 120. Temporary power supply 132 can be temporarily connected to power source 120 in many different ways, such as clipping positive temporary power supply connection 133 to the positive power port of temporary power supply 132, and clipping negative temporary power supply connection 134 to the negative power pot of temporary power supply 132. Temporary power supply 132 provides temporary light source input power 135 to light source power collection circuit 117. Light source power collection circuit 117 sends collected light source power 121 to light source power distribution circuit 116 in response to receiving starting power 135. Light source power collection circuit 117 sends collected light source power 121 to light source power distribution circuit 116 using collected light source power connections 118 and 119. Light source power distribution circuit 116 receives collected light source power 121 from light source power collection circuit 117, and sends light source electrical power 152 to light source 130 in response. In this way light source power distribution circuit 116 delivers light source electrical power 152 to light source 130 in response to light source power collection circuit 117 receiving temporary light source input power 135 from temporary power supply 132. In this way power distribution circuit 110 delivers light source electrical power 152 to light source 130 in response to receiving temporary light source input power 135 from temporary power supply 132.

Temporary power supply 132 can be many different types of power sources. Temporary power supply 132 is not a part of power source 120 according to the invention, and is therefore shown in dotted lines in FIG. 3 and FIG. 4. Temporary power supply 132 can be a battery, a plug-in power supply, or any other type of device capable of delivering starting electrical energy to power source 120. In the embodiment shown temporary power supply 132 delivers one second of electrical energy to power collection circuit 117 of power distribution circuit 110, which activates power source 120 as discussed above. Temporary power supply 132 can be any source of electrical power which causes light source 130 to generate light 140. Temporary power supply 132 is temporarily connected to power source 120 in order to activate power source 120. Once power source 120 is activated, temporary power supply 120 is disconnected from power source 120. Once activated, power source 120 continues to generate output power 148 even after temporary power supply 132 is disconnected.

During normal operation of power source 120, where normal operation is the operation of power source 120 where power source 120 is generating output power 148 and temporary power supply 132 is not connected to power source 120, light source power collection circuit 117 receives power that is generated by one or more of the photovoltaic devices in power generation module 126. In the embodiment shown in FIG. 3 and FIG. 4, light source power collection circuit 117 receives photovoltaic-generated electrical power 150 from top photovoltaic devices 101. Light source power collection circuit 117 sends collected light source power 121 to light source power distribution circuit 116 in response to receiving top photovoltaic-generated electrical power 150 from top photovoltaic devices 101. Light source power distribution circuit 116 sends light source electrical power 152 to light source 130 in response to receiving collected light source power 121 from light source power collection circuit 117. Light source power distribution circuit 116 delivers light source electrical power 152 to light source 130 in response to light source power collection circuit 117 receiving top photovoltaic-generated electrical power 150 from top photovoltaic device 101. Power distribution circuit 110 delivers light source electrical power 152 to light source 130 in response to receiving top photovoltaic-generated electrical power 150 from top photovoltaic device 101.

Power output circuit 114 collects electrical power generated by power generation module 126 and delivers output power 148 through power output contacts 122 and 124 in response. In the embodiment of power source 120 shown in FIG. 3 and FIG. 4, power output circuit 114 receives bottom photovoltaic-generated electrical power 151 from electricity generation modules 128. Power output circuit 114 delivers output power 148 in response to receiving bottom photovoltaic-generated electrical power 151 from bottom photovoltaic devices 102 of electricity generation modules 128. Power source 120 delivers output power 148 in response to power output circuit 114 receiving photovoltaic-generated electrical power 151 from electricity generation module 128.

Power distribution circuit 110 can include other circuits and modules and can perform many other functions in some embodiments of power source 120. In some embodiments power distribution circuit 110 performs power conversion on either input power or output power. In some embodiments power distribution circuit 110 performs power transformation on either input power or output power. Power distribution circuit 110 can be any of the power distribution circuit examples shown or described in this document, or other types or forms of power distribution circuit.

Power generation module 126 of power source 120 includes at least one electricity generation module 128. In the embodiment power generation module 126 shown in FIG. 3 and FIG. 4, power generation module 126 includes four electricity generation modules 128. Electricity generation module 128 generates electrical power, which is sent to power distribution circuit 110 for distribution. Electricity generation module 128 includes light source 130 and top and bottom photovoltaic devices 101 and 102. Upon activation, where activation means the temporary providing of temporary light source input power 135 through input power contacts 133 and 134, light source 130 generates light 140. Photovoltaic devices 101 and 102 generate electrical power in response to receiving light 140 from light source 130.

Temporary light source input power 135 is disconnected after activation of power source 120, and henceforth temporary light source input power 135 is no longer needed. Light source 130 continues to generate light 140 after activation and discontinuation of temporary light source input power 135. Photovoltaic devices 101 and 102 continue to output photovoltaic-generated electrical power 150 and 151 in response to receiving light 140. A portion of the electrical power generated by photovoltaic devices 101 and 102 is used to power the continuing operation of light source 130, and a portion is output from electricity generation module 128, power generation module 126, and power source 120, and can be used to power external devices.

The block diagram of FIG. 3 shows the details of one electricity generation module 128. In the embodiment shown in FIG. 3 and FIG. 4, each electricity generation module 128 is the same or similar in operation. In some embodiments the optical or electrical configuration of the multiple electricity generation modules 128 are different from each other.

Each of the embodiments of power source 120 shown in FIG. 1 through FIG. 4 includes photovoltaic devices 101 and 102. Photovoltaic devices 101 and 102 are in optical communication with light source 130, such that light 140 from light source 130 is received (absorbed) by photovoltaic devices 101 and 102. Photovoltaic devices 101 and 102 output photovoltaic-generated electrical power 146, 150, or 151 in response to receiving light 140 from light source 130. Light source 130 and photovoltaic devices 101 and 102 are designed such that photovoltaic devices 101 and 102 generate a higher level of electrical power than is needed by light source 130 to continue to generate light 140. This allows the excess electrical power generated to be output from power source 120 and used to power external devices. In this way power source 120 includes photovoltaic devices 101 and 102 in optical communication with light source 130. Photovoltaic devices 101 and 102 create photovoltaic-generated electrical power 146, 150 and 151 in response to receiving light 140 from light source 130. A portion of the electrical power generated by photovoltaic devices 101 and 102 is used to power light source 130, while the remaining portion is output from power source 120 and used to power electronic devices.

Power source 120 can be turned off when output power 148 from power source 120 is no longer needed and/or power source 120 is going to be temporarily stored. Power source 120 can be turned off in many different ways. In some embodiments light source power distribution circuit 116 can be instructed to stop sending light source electrical power 152 to light source 130, which will stop light source 130 from generating light 140, and power source 120 will shut down. In some embodiments power source 120 can include a power-off switch which will disconnect electrical connections 136 and 137 from light source 130. In some embodiments of power source 120 this switch will be externally mounted on power source 120. Power source 120 can be turned off in any way which will stop light source 130 from generating light 140. Power source 120 can be turned off in other ways, such as stopping photovoltaic devices 101 and 102 from outputting photovoltaic-generated electrical power 146, 150, or 151. Power source 120 can be turned off in many different ways. Power source 120 can then be re-activated when needed. Power source 120 does not need re-charging. When electrical power from power source 120 is needed again, power source 120 is connected to temporary power supply 132 for activation, which begins the power generation process by power source 120. Temporary power supply 132 is then disconnected and power source 120 will continue to generate electrical power 148 until turned off.

Figure 5:
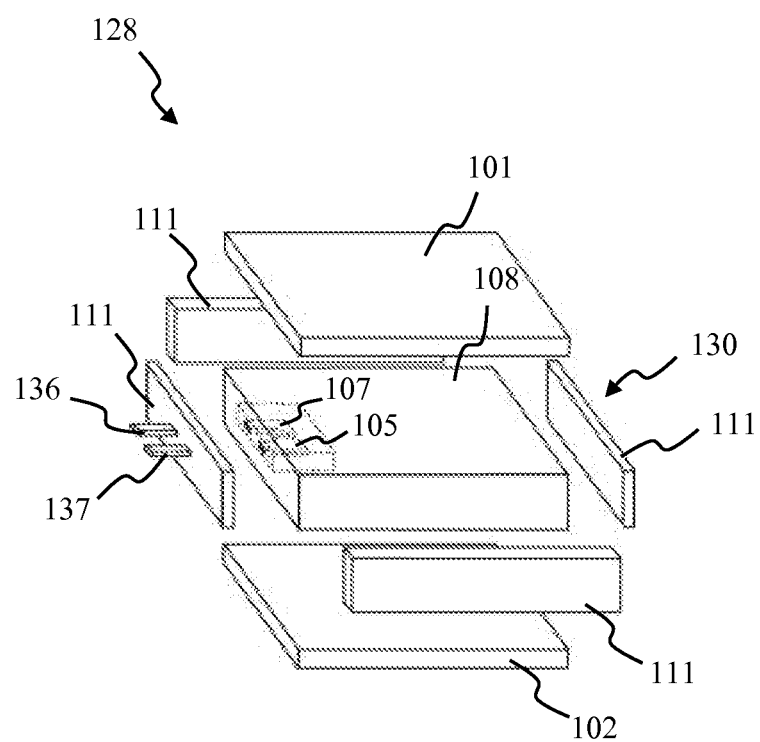
FIG. 5 shows an exploded perspective view of electricity generation module 128 of power source 120 of FIG. 3.
Figure 6:
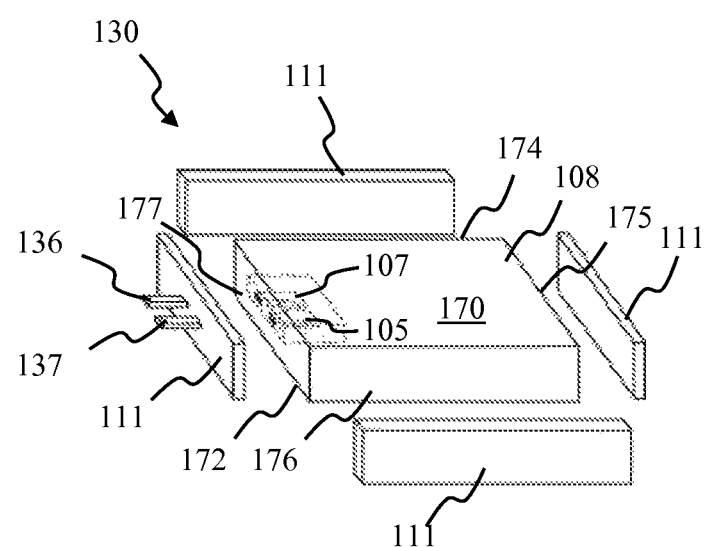
FIG. 6 shows an exploded perspective view of light source 130 of electricity generation module 128 of FIG. 5.

FIG. 5 and FIG. 6 show exploded views of one embodiment of electricity generation module 128 (FIG. 5), and light source 130 (FIG. 6). Electricity generation module 128 as shown in FIG. 5 is used in power source 120 of FIG. 3 and FIG. 4. Electricity generation module 128 as shown in FIG. 5 can be used in other embodiments of power source 120 as needed. In some embodiments of power source 120 according to the invention, other embodiments of electricity generation module 128 are used.

Light source 130 as shown in FIG. 6 is used in power source 120 of FIG. 1, FIG. 2, FIG. 3, and FIG. 4. Light source 130 as shown in FIG. 6 can be used in other embodiments of power source 120 as needed. In some embodiments of power source 120 according to the invention, other embodiments of light source 130 are used.

In the embodiment of electricity generation module 128 shown in FIG. 5, electricity generation module 128 is a layered construction, with light source 130 sandwiched between top photovoltaic device 101 and bottom photovoltaic device 102. Light source 130 in this embodiment includes block of optical coupling material 108, light-emitting device 105, and mirrors 111, as shown in FIG. 5 and FIG. 6. Block of optical coupling material 108 is molded to have a rectangular form in this embodiment. Light-emitting device 105 and balance resistors 107 are embedded in optical coupling material 108. Optical coupling material 108 optically couples light-emitting device 105 to top photovoltaic device 101 and bottom photovoltaic device 102. Thus photovoltaic devices 101 and 102 are in optical communication with light source 130. Photovoltaic devices 101 and 102 are in optical communication with light-emitting device 105.

Block of optical coupling material 108 according to the invention can take many different forms. The term block here is used to mean "piece of material" and is not meant to be restrictive or limiting on the size or shape of block of optical coupling material 108.

Light source 130 of FIG. 5 and FIG. 6 includes top surface 170, bottom surface 172, and light source first edge 174, second edge 175, third edge 176, and fourth edge 177. Mirrors 111 are positioned at edges 174, 175, 176, and 177 in this embodiment to reflect light back into light source 130, as shown in FIG. 5 and FIG. 6.

Top photovoltaic device 101 is positioned adjacent top surface 170 of light source 130 such that top photovoltaic device 101 is in optical communication with top surface 170 of light source 130 and receives light 140 from light source 130. In some embodiments top photovoltaic device 101 is optically bonded to top surface 170. In some embodiments top photovoltaic device 101 is embedded in light source 130 optical coupling material 108. Bottom photovoltaic device 102 is positioned adjacent bottom surface 172 of light source 130 such that bottom photovoltaic device 102 is in optical communication with bottom surface 172 of light source 130, and receives light 140 from light source 130. In some embodiments bottom photovoltaic device 102 is optically bonded to bottom surface 172. In some embodiments bottom photovoltaic device 102 is embedded in light source 130 optical coupling material 108.

In the embodiment of power source 120 shown in FIG. 3 through FIG. 6, light 140 emitted through top surface 170 of light source 130 is absorbed (received) by top photovoltaic device 101. Top photovoltaic device 101 generates top photovoltaic-generated electrical power 150 in response to receiving light 140. Top photovoltaic-generated electrical power 150 is collected via top electrical connections 155 and 156 and sent to power collection circuit 117 of power distribution circuit 110. Power collection circuit 117 delivers collected light source electrical power 121 to light source power distribution circuit 116 in response to receiving top photovoltaic-generated electrical power 150 from top photovoltaic device 101. Light source power distribution circuit 116 conditions collected light source electrical power 121 from light source power collection circuit 117 and sends light source electrical power 152 to light source 130. "Conditioning" power can include any number of electrical routing and processing operations, from routing power straight through to transforming, buffering, isolating, converting, or other electrical power operations. Light source electrical power 152 is used to power light source 130. Light source electrical power 152 is delivered to light source 130 via light source power electrical connections 136 and 137 in this embodiment.

In the embodiment of power source 120 shown in FIG. 3 through FIG. 6, top photovoltaic device 101 is an organic photovoltaic solar cell which generates electrical power in response to absorbing light. In some embodiments top photovoltaic device 101 is a silicon photovoltaic device which generates electrical power in response to absorbing light. In some embodiments top photovoltaic device 101 is a cadmium telluride photovoltaic device which generates electrical power in response to absorbing light. Top photovoltaic device 101 can be any photovoltaic material, layer, module, or device which generates electrical power in response to absorbing light. Top photovoltaic device 101 is designed to operate efficiently when absorbing light 140 from light source 130, as will be discussed shortly.

In the embodiment of power source 120 shown in FIG. 3 through FIG. 6, bottom photovoltaic device 102 generates bottom photovoltaic-generated electrical power 151 in response to receiving light 140 from light source 130. Bottom photovoltaic-generated electrical power 151 is collected via bottom electrical connections 159 and 160 and sent to power output circuit 114. Power output circuit 114 conditions bottom photovoltaic-generated electrical power 151 received from bottom photovoltaic device 102 and delivers output power 148 through power output contacts 122 and 124 for use in powering external devices. Output power 148 is the power generated by power source 120 and can be used as needed for powering many types of electrical devices, as discussed earlier.

In this embodiment bottom photovoltaic device 102 is an organic photovoltaic solar cell which generates electrical power in response to absorbing light. In some embodiments bottom photovoltaic device 102 is a silicon photovoltaic device which generates electrical power in response to absorbing light. In some embodiments bottom photovoltaic device 102 is a cadmium telluride photovoltaic device which generates electrical power in response to absorbing light. Bottom photovoltaic device 102 can be any photovoltaic material, layer, module, or device which generates electrical power in response to absorbing light. Bottom photovoltaic device 102 is designed to operate efficiently when absorbing light 140 from light source 130, as will be discussed shortly.

In some embodiments light source 130 is included in photovoltaic device 101 or 102. For example, in some embodiments block of optical coupling material 108 is a semiconductor material that is doped to become a photovoltaic device. Block of optical coupling material 108 becomes the photovoltaic device. Block of optical coupling material 108, which is photovoltaic device 101 or 102 in this embodiment, can be designed to include light-emitting device 105 of light source 130. Thus in this embodiment photovoltaic device 101 or 102 includes light source 130.

In the embodiment of power source 120 shown in FIG. 3 through FIG. 6, top photovoltaic-generated electrical power 150 collected from top photovoltaic device 101 is used to power light source 130, while bottom photovoltaic-generated electrical power 151 collected from bottom photovoltaic device 102 is used to provide output power 148. In some embodiments of power source 120 according to the invention, the power collected from any particular photovoltaic device is used for other purposes. In some embodiments a portion or all of top photovoltaic-generated electrical power 150 collected from top photovoltaic device 101 is used to provide output power 148. In some embodiments of power source 120, a portion or all of bottom photovoltaic-generated electrical power 151 collected from bottom photovoltaic device 102 is used to power light source 130. In some embodiments photovoltaic-generated electrical power 150 or 151 collected from top or bottom photovoltaic devices 101 or 102 is used for other purposes. The amount and routing of photovoltaic-generated electrical power 150 and 151 collected from top and bottom photovoltaic devices 101 and 102 depends on the specific design and use of power source 120, the specific efficiency of light source 130, and the specific output voltage and current desired from power source 120. It is to be understood that the figures shown represent example embodiments of power source 120, and that many other specific wiring and mechanical configurations are possible according to the invention.

Power source 120 often uses more than one electricity generation module 128. In the embodiment shown in FIG. 3 through FIG. 6, power generation module 126 of power source 120 includes four electricity generation modules 128 stacked one on top of the other, which creates alternating layers of light sources 130 and photovoltaic devices 101 and 102, as shown in FIG. 4. Each electricity generation module 128 generates electrical power. In the embodiment shown in FIG. 3 through FIG. 6, each top photovoltaic device 101 generates electrical power which contributes to top photovoltaic-generated electrical power 150. Each bottom photovoltaic device 102 generates electrical power which contributes to bottom photovoltaic-generated electrical power 151, which is collected by power output circuit 114 and provided as output power 148 to power external devices. In this way a portion of the electrical power generated by each electricity generation module 128 is used to provide output power 148, and a portion of the electrical power generated by electricity generation module 128 is used to power light sources 130.

In the embodiment shown in FIG. 3 through FIG. 6, top photovoltaic devices 101 are connected in parallel, and bottom photovoltaic devices 102 are connected in parallel. In this embodiment each photovoltaic device 101 and 102 generates 3 volts at 20 milliamps of power. Each electricity generation module 128 therefore generates 3 volts at 20 milliamps of top photovoltaic-generated electrical power 150. Connecting the four electricity generation modules 128 in parallel as shown in FIG. 4 provides a total of 3 volts at 80 milliamps of usable output power 148. If the four electricity generation modules 128 are connected in series then a total of 12 volts at 20 milliamps of usable output power 148 is generated.

It is to be understood that the specific electrical connections of top photovoltaic devices 101, bottom photovoltaic devices 102, and electricity generation modules 128 according to the invention can be varied to provide other specific output voltages or current capability. Different numbers and connections of electricity generation modules 128 are used to generate different amounts, voltages, and currents of power output 148. Top photovoltaic devices 101 can be connected in parallel, series, or any combination depending on the specific current and voltage required and/or desired. Bottom photovoltaic devices 102 can be connected in parallel, series, or any combination depending on the specific current and voltage required and/or desired. Any number of electricity generation modules 128 can be used in power generation module 126 of power source 120 according to the invention. The individual electricity generation modules 128 of power generation module 126 can be connected in any way in power source 120 according to the invention. Each electricity generation module 128 can include any number of light sources 130 and photovoltaic devices 101 and 102. Different numbers and interconnection techniques of the individual elements included in power source 120 according to the invention is used to generate varying amounts, voltages, and currents of generated output power 148.

In some embodiments the inner top and bottom photovoltaic devices 101 and 102 which are back-to-back to each other as shown in FIG. 4 are formed on a single substrate, with one photovoltaic device collecting light from light source 130 above the single substrate, and one photovoltaic device collecting light from light source 130 below the single substrate.

In the embodiment shown in FIG. 3 through FIG. 6, light-emitting device 105 is embedded in block of optical coupling material 108. Light-emitting device 105 of light source 130 emits light into block of optical coupling material 108. In this embodiment optical coupling material 108 is a molded optical grade casting resin. Light emitted by light-emitting device 105 travels through optical coupling material 108 until it exits light source 130 through top surface 170 or bottom surface 172. Optical mirrors 111 are placed at first edge 174, second edge 175, third edge 176, and fourth edge 177 to keep light from exiting at those surfaces. Mirrors 111 reflect light that is incident on edge surface 174, 175, 176, and 177 back into optical coupling material 108. In this embodiment mirrors 111 are embedded into optical coupling material 108. In some embodiments mirrors 111 are optically bonded to edge 174, 175, 176, and 177 of light source 130. In some embodiments mirrors 111 are placed adjacent edge surfaces 174, 175, 176, and 177.

In some embodiments optical coupling material 108 is a material different than an optical grade casting resin. Optical coupling material 108 can be any material which optically couples light source 130 to photovoltaic devices 101 and 102, and/or optically couples light-emitting device 105 to photovoltaic devices 101 and 102. Optical coupling increases the optical efficiency of a device and often involves optically connecting two optical devices so that light passing from one to the other does not have to pass through an air gap. Air gaps can reflect light and decrease the efficiency of an optical system. In this embodiment optical coupling material 108 is used so that light emitted from light-emitting device 105 is directed to photovoltaic device 101 and 102 without having to pass through an air gap. In some embodiments of electricity generation module 128, other means are used to place photovoltaic device 101 and 102 in optical communication with light source 130 and/or light-emitting device 105.

In the embodiment shown in FIG. 3 through FIG. 6, light source electrical connections 136 and 137 pass through mirror 111 that is at edge 177 to provide light source power 152 to light-emitting device 105 embedded in optical coupling material 108. In this embodiment resistor 107 is also embedded in optical coupling material 108 and connected to light source positive electrical connection 136 and the positive terminal of light-emitting device 105. Resistor 107 is used to balance the multiple light-emitting devices 105 so that each one emits a similar amount of light. Light from light-emitting device 105 travels inside optical coupling material 108 until it exits either top surface 170 or bottom surface 172. Light exiting top surface 170 or bottom surface 172 impinges on top photovoltaic device 101 or bottom photovoltaic device 102, and is converted into electrical power, as explained earlier.

Light source 130 can be formed in any shape and configuration which allows light from light-emitting device 105 to be directed to a photovoltaic device. In some embodiments optical coupling material 108 is formed in shapes other than rectangular. In some embodiments different numbers of light-emitting devices and photovoltaic devices are used in light source 130. In some embodiments no optical coupling material 108 is used, and light travels through air or some other medium as it travels from light-emitting device 105 to a photovoltaic device. Light source 130 can take any form or configuration which puts the one or more than one photovoltaic devices used in electricity generation module 128 in optical communication with light-emitting device 105.

Figure 7:
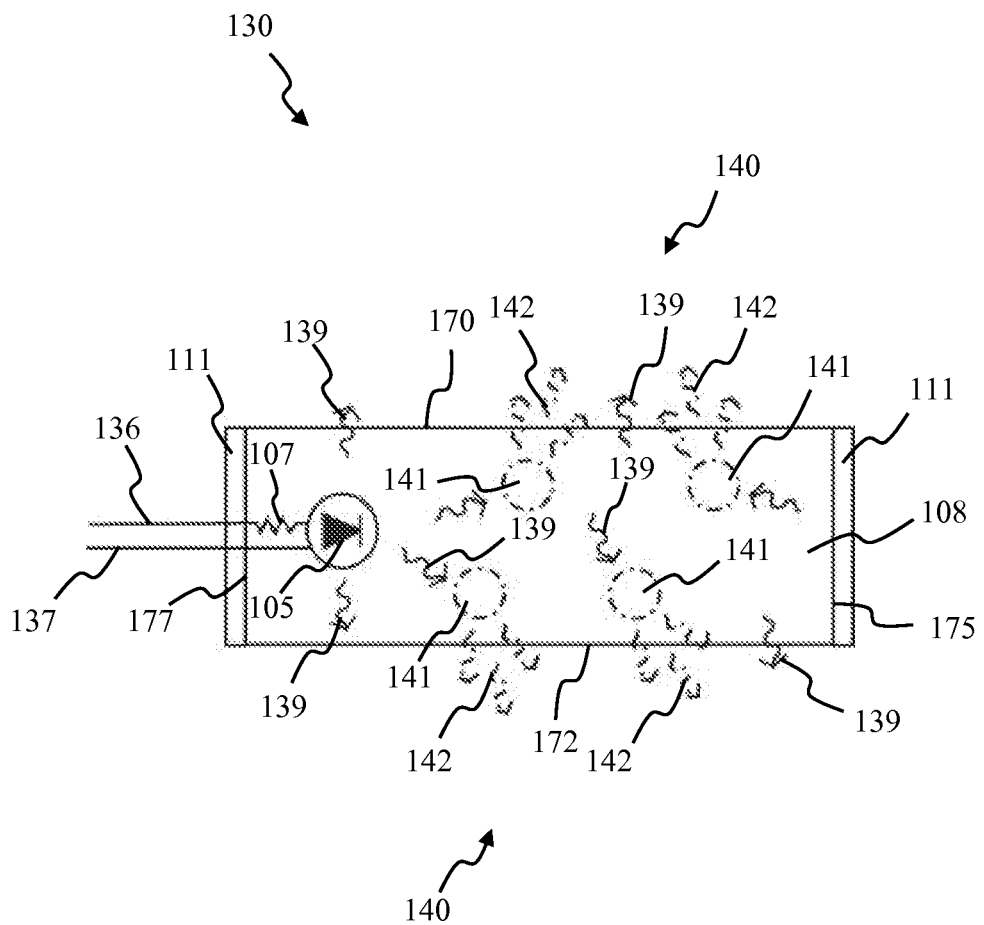
FIG. 7 shows a side view cross-section of an embodiment of light source 130 of FIG. 6.
Figure 8:
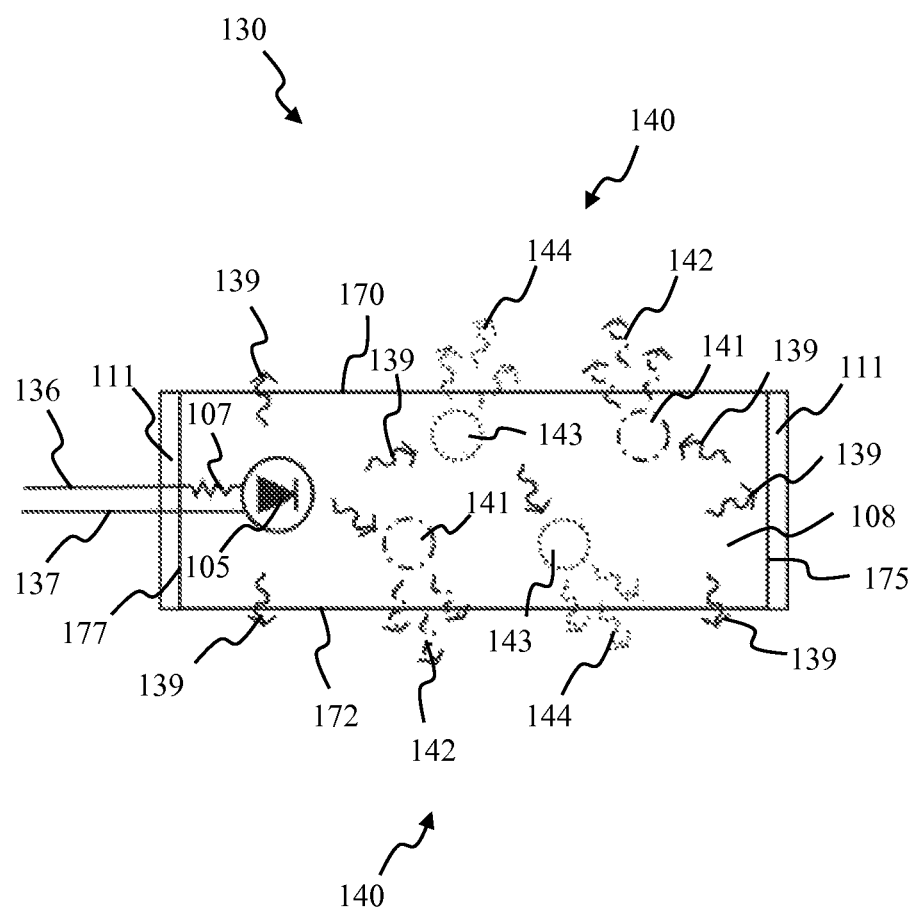
FIG. 8 shows a side view cross-section of a further embodiment of light source 130 of FIG. 6.
Figure 9:
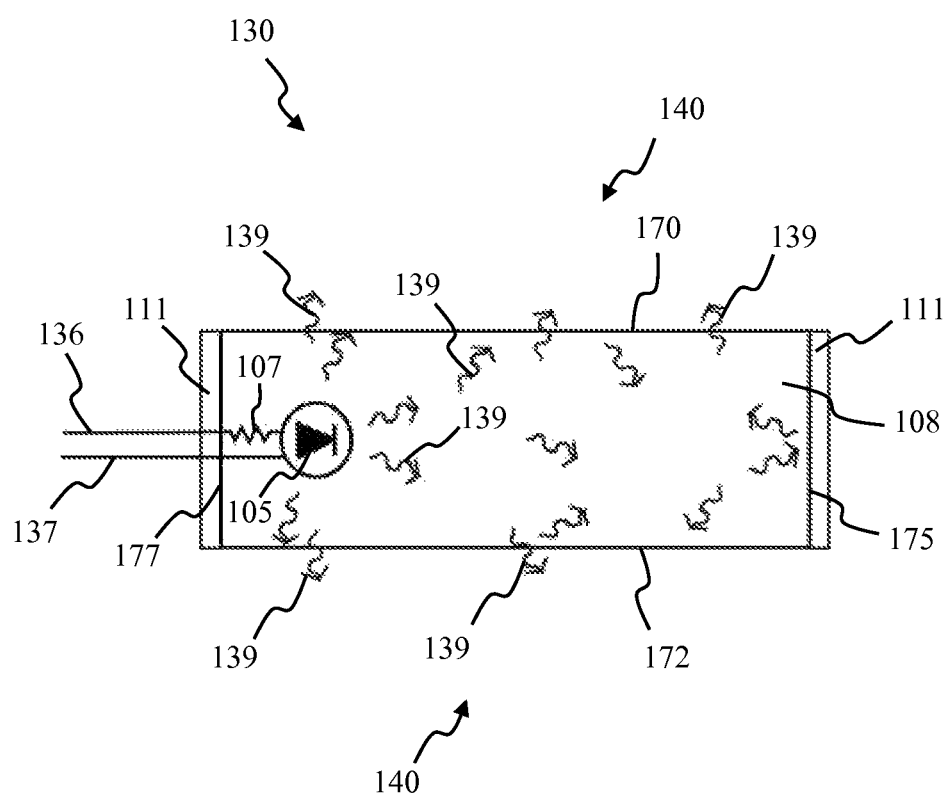
FIG. 9 shows a side view cross-section of an additional embodiment of light source 130 of FIG. 6.

Light source 130 according to the invention can take many different forms. Light source 130 is designed to efficiently deliver light 140 to photovoltaic devices 101 and 102. FIG. 6 through FIG. 9 show various embodiments of light source 130 which can be used in any of the power source 120 embodiments shown in FIG. 1 through FIG. 4. In some embodiments light source 130 is a photoluminescent light source. In some embodiments, light source 130 is a combination photoluminescent/electroluminescent light source. FIG. 7 and FIG. 8 show examples of embodiments of light source 130 in which light source 130 is a photoluminescent light source 130. FIG. 9 shows an example embodiment of light source 130 in which light source 130 is not a photoluminescent light source. These are examples only and are not meant to be limiting. Light source 130 according to the invention can take many different forms and is not restricted to the example embodiments shown.

Light source 130 in the embodiment shown in FIG. 7 and FIG. 8 are examples of photoluminescent light sources 130. Light sources 130 in the embodiments shown in FIG. 7 and FIG. 8 use photoluminescent materials to perform optical amplification. Light sources 130 in these embodiments include photoluminescent materials embedded in optical coupling material 108. The photoluminescent materials allow light source 130 to amplify the light emitted by light-emitting device 105, making light source 130 efficient and allowing power source 120 to generate more power than is consumed by light source 130. Optical amplification can occur with many different photoluminescent materials and light emitting devices, as is well known in the art of light amplification from stimulated emission as is used in lasers, luminescent solar cells, and other photoluminescent devices. Light source 130 in these embodiments include light-emitting devices 105, which are electroluminescent devices. When some of light 139 exits light source 130 to become part of light 140, light source 130 is both photoluminescent and electroluminescent, because some of the light 140 exiting light source 130 is created by photoluminescent activity and some of light 140 exiting light source 130 is created by electroluminescent activity.

In the embodiment of photoluminescent light source 130 shown in FIG. 7, light-emitting device 105 and photoluminescent material 141 are embedded in block of optical coupling material 108. In this embodiment light-emitting device 105 emits light 139 which has a first peak wavelength and a first wavelength range. In this embodiment light 139 has a peak wavelength in the blue range of the visible spectrum and is indicated by the solid light ray lines in FIG. 7. Some of blue light 139 emitted by light-emitting device 105 embedded in optical coupling material 108 exits top surface 170 or bottom surface 172, becoming part of light 140 emitted from light source 130. Light 140 includes all of the light rays which exit light source 130 from either top surface 170 or bottom surface 172, regardless of their source.

Light-emitting device 105 can emit light of any peak wavelength and any wavelength range. In some embodiments light-emitting device 105 emits light in the green range of the visible spectrum. In some embodiments device 105 emits light with a peak wavelength of 532 nanometers. In some embodiments light-emitting device 105 emits light with a color other than green or blue. In some embodiments light-emitting device 105 emits light that has a peak wavelength outside the visible spectrum.

Photoluminescent material 141 is embedded in optical coupling material 108. Embedding photoluminescent material 141 in optical coupling material 108 places photoluminescent material 141 in optical communication with both light-emitting device 105 and photovoltaic devices 101 and 102. In this embodiment photoluminescent material 141 is a green phosphor photoluminescent material which emits light 142 in response to absorbing blue light 139. Light 142 has a second peak wavelength and a second wavelength range. In this embodiment light 142 has a peak wavelength in the green range of the visible spectrum and is indicated by dot-dashed light ray lines in FIG. 7. Photoluminescent material 141 emits more than one photon for each photon it absorbs. In this way photoluminescent material 141 performs optical amplification. Light 139 that hits photoluminescent material 141 embedded in optical coupling material 108 causes light 142 to be emitted by photoluminescent material 141. Light 142 emitted by photoluminescent material 141 travels through optical coupling material 108 until light 142 exits either top surface 170 or bottom surface 172. In this way light 142 becomes part of light 140 emitted from light source 130. In this way light 142 becomes part of light 140 impinging on photovoltaic devices 101 and/or 102.

When light source 130 of FIG. 7 is used in the embodiment of power source 120 shown in FIG. 3 through FIG. 6, light 140, which includes light 139 from light-emitting device 105 and light 142 from photoluminescent material 141, impinges on top photovoltaic device 101 and bottom photovoltaic device 102, causing top photovoltaic device 101 and bottom photovoltaic device 102 to create photovoltaic-generated electrical power 150 and 151. Thus top and bottom photovoltaic device 101 and 102 are in optical communication with photoluminescent material 141. And top and bottom photovoltaic device 101 and 102 are optically coupled to photoluminescent material 141.

Top photovoltaic device 101 creates top photovoltaic-generated electrical power 150 in response to receiving light 140 from light source 130. Light 140 in the embodiment of light source 130 shown in FIG. 7 includes light 139 emitted by light-emitting device 105 and light 142 emitted by photoluminescent material 141. Light 142 is emitted by photoluminescent material 141 in response to receiving light 139 emitted by light-emitting device 105. Top photovoltaic-generated electrical power 150 is routed through power distribution circuit 110 and becomes light source electrical power 152, which is used to power light-emitting device 105.

Bottom photovoltaic device 102 creates bottom photovoltaic-generated electrical power 151 in response to receiving light 140 from light source 130. Light 140 in the embodiment of light source 130 shown in FIG. 7 includes light 139 emitted by light-emitting device 105 and light 142 emitted by photoluminescent material 141. Light 142 is emitted by photoluminescent material 141 in response to receiving light 139 emitted by light-emitting device 105. Bottom photovoltaic-generated electrical power 151 is routed through power distribution circuit 110 and becomes output power 148, which can be used to power external electrical devices. In this example power source 120 includes photoluminescent light source 130, which generates light 140 in response to receiving light source power 152. Photovoltaic devices 101 and 102 generate electrical power 150 and 151 in response to receiving light 140 from light source 130. A first portion of photovoltaic-generated electrical power 150 and 151 is used to power light source 130. A second portion of photovoltaic-generated electrical power 150 and 151 is provided as output power 148.

The efficiency and amount of output power 148 that power source 120 is able to generate is related to the ability of light source 130 to emit light 140 with a peak wavelength and wavelength range that top photovoltaic device 101 and bottom photovoltaic device 102 are able to efficiently convert to photovoltaic-generated electrical power 150 and 151. There are different types of photovoltaic devices and materials known in the art, which are sensitive to different peak wavelength and wavelength ranges, and can be used in power source 120 according to the invention. There are many different types of light-emitting devices known in the art capable of emitting light with various peak wavelength and wavelength ranges that can be used in power source 120 according to the invention. And there are many different types of photoluminescent materials known in the art capable of absorbing light of specific wavelengths and emitting light of another wavelength that can be used in power source 120 according to the invention. It is to be understood that many different embodiments of power source 120 are possible using different combinations of light-emitting devices 105, photoluminescent materials 141, and photovoltaic devices 101 and 102. Light-emitting device 105 can be any one or more than one light-emitting device which emits in any one or more than one peak wavelength or wavelength range. Light-emitting device 105 does not have to emit visible light, but can emit ultraviolet, infrared, or visible light, or light in any other range. Photoluminescent material 141 can include any one or more than one photoluminescent material which absorbs light in any one or more than one peak wavelength or wavelength range and emits light in any one or more than one peak wavelength or wavelength range in response. Photoluminescent material 141 can absorb and/or emit light in the visible, ultraviolet, or infrared ranges, or any other range of light. Photovoltaic devices 101 or 102 can be any one or more than one photovoltaic material, device, layer, or module which absorbs light from any one or more than one peak wavelength or wavelength range and generates electrical power in response. Photovoltaic devices 101 and 102 can absorb light in the visible, infrared, ultraviolet, or any other range of light.

FIG. 8 shows a side view cross-section of an embodiment of light source 130 used in the embodiment of power source 120 of FIG. 3 through FIG. 6. In this embodiment power source 120 is able to generate power with an efficiency such that half of the photovoltaic devices 101 and 102 are used to supply electrical power to light source 130, and the other half of the photovoltaic devices 101 and 102 are used to provide output power 148. In this embodiment top photovoltaic devices 101 generate top photovoltaic-generated electrical power 150, eventually fed back as light source electrical power 152 to power light source 130, as discussed earlier. Bottom photovoltaic devices 102 generate bottom photovoltaic-generated electrical power 151, eventually delivered as output power 148 as discussed earlier.

Light source 130 as shown in FIG. 8 includes light-emitting device 105, photoluminescent material 141, and photoluminescent material 143 embedded in optical coupling material 108. Light-emitting device 105 emits blue light 139 in response to receiving light source electrical power 152. Photoluminescent material 141 emits green light 142 in response to absorbing blue light 139 emitted by light-emitting device 105, as discussed earlier.

Photoluminescent material 143 is embedded in optical coupling material 108. Embedding photoluminescent material 143 in optical coupling material 108 places photoluminescent material 143 in optical communication with both light-emitting device 105 and photovoltaic devices 101 and 102. In this embodiment photoluminescent material 143 is a blue-green phosphor photoluminescent material which emits light 144 in response to absorbing blue light 139. Light 144 has a third peak wavelength and a third wavelength range. In this embodiment light 144 has a peak wavelength in the blue-green range of the visible spectrum and is indicated by the dashed light ray lines in FIG. 8. Photoluminescent material 143 emits more than one photon for each photon it absorbs. In this way photoluminescent material 143 performs optical amplification. Light 139 that hits photoluminescent material 143 embedded in optical coupling material 108 causes light 144 to be emitted by photoluminescent material 143. Light 144 emitted by photoluminescent material 143 travels through block of optical coupling material 108 until light 144 exits either top surface 170 or bottom surface 172. In this way light 144 becomes part of light 140 emitted from light source 130. In this way light 144 becomes part of light 140 impinging on photovoltaic devices 101 and 102. Photoluminescent material 143 emits light 144 in response to absorbing light 139 emitted by light-emitting device 105.

In the embodiment of light source 130 shown in FIG. 8, photoluminescent material 143 is a blue-green phosphor. In some embodiments photoluminescent material 143 is a different photoluminescent material which emits blue-green light in response to absorbing blue light. Light 139, 142, and 144 travel through optical coupling material 108 until they exit light source 130 through either top surface 170 or bottom surface 172 as light 140. Mirrors 111 keep light 139, 142, and 144 from exiting through edges 174, 175, 176, or 177. Light 139, 142, and 144 exiting top surface 170 and bottom surface 172 become light 140 emitted from light source 130, and impinge on either top photovoltaic device 101 or bottom photovoltaic device 102. Top and bottom photovoltaic device 101 and 102 are in optical communication with photoluminescent material 141 and 143. Top and bottom photovoltaic device 101 and 102 are optically coupled to photoluminescent material 141 and 143.

Top photovoltaic device 101 generates top photovoltaic-generated electrical power 150 in response to receiving light 140 from light source 130. Top photovoltaic-generated electrical power 150 is received by power distribution circuit 110. Power distribution circuit 110 provides light source electrical power 152 to power light-emitting device 105 of light source 130 in response to receiving top photovoltaic generated electrical power 150. Bottom photovoltaic device 102 generates bottom photovoltaic-generated electrical power 151 in response to receiving light 140 from light source 130. Bottom photovoltaic-generated electrical power 151 is received by power distribution circuit 110 and converted into output power 148 and can be used to power external devices. In this way power source 120 includes photoluminescent light source 130, where photoluminescent light source 130 generates light 140 in response to receiving light source power 152. In this way power source 120 includes photovoltaic devices 101 and 102 in optical communication with photoluminescent light source 130, where photovoltaic devices 101 and 102 generate photovoltaic-generated electrical power 150 and 151 in response to receiving light 140 from light source 130. Photovoltaic-generated electrical power 151 is conducted to light source 130 such that photovoltaic-generated electrical power 151 powers light source 130. In this way a portion of the photovoltaic-generated electrical power generated by photovoltaic devices 101 and 102 is used to power light source 130. Light source 130 includes light-emitting device 105 and photoluminescent materials 141 and 143 in optical communication with light-emitting device 105, where photoluminescent materials 141 and 143 emit light 142 and 144 in response to absorbing light 139 from light-emitting device 105.

In the embodiment shown in FIG. 3 through FIG. 6, and FIG. 8, power generation module 126, including four electricity generation modules 128, each with light sources 130 and photovoltaic devices 101 and 102, are all embedded in optical coupling material 108 and formed into one molded piece. In some embodiments power distribution circuit 110 is also embedded in optical coupling material 108. This creates a compact, optically efficient and power-efficient power source 120 which can be used to power many different types of electrical devices and components. In some embodiments the individual electricity generation modules 128 are embedded separately in a plurality of blocks of optical coupling material 108, which creates electricity generation module 128 'building blocks' which can be connected in various ways and stacked in various ways to create different power sources 120.

FIG. 9 shows a side view cross-section of another embodiment of light source 130. In this embodiment there are no photoluminescent materials embedded in optical coupling material 108. In this embodiment light source 130 is not a photoluminescent light source. Otherwise power source 120 using light source 130 as shown in FIG. 9 operates the same or similar to that shown in FIG. 3 through FIG. 7. Light 140 emitted from light source 130 includes light 139 that is emitted from light-emitting device 105. This embodiment does not take advantage of the amplification of light which can occur through the use of photoluminescent materials in light source 130. The efficiency and power output of this embodiment of power source 120 depends on the wavelength of light 139 emitted by light-emitting device 105 and the sensitivity of top and bottom photovoltaic devices 101 and 102 to light 139.

Figure 10:
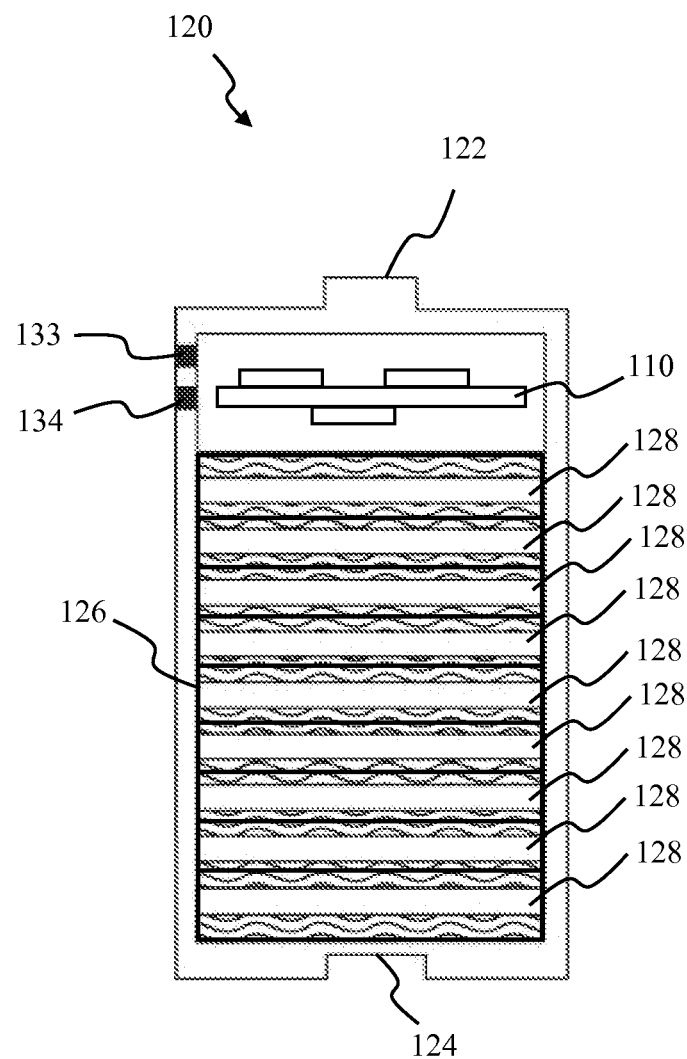
FIG. 10 shows a side view cross-section of an embodiment of power source 120 with a form factor of a chemical storage battery.
Figure 11:
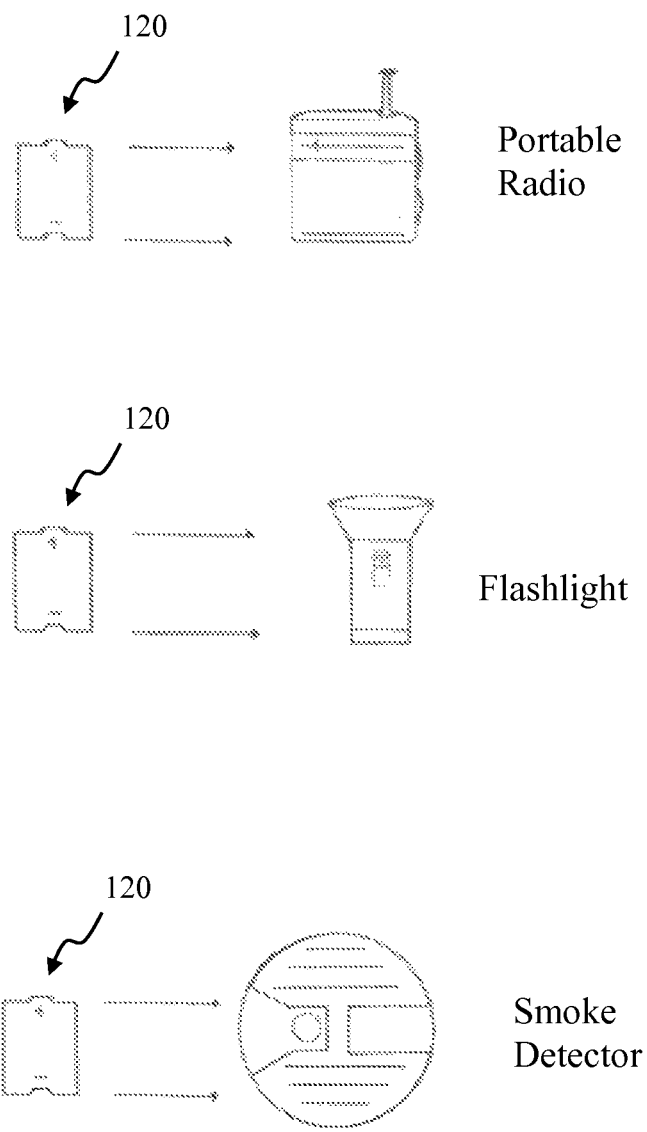
FIG. 11 shows three examples of products that power source 120 according to the invention can provide electrical power to, including a portable radio, a flashlight, and a smoke detector.

FIG. 10 shows a side view cross-section of an embodiment of power source 120 according to the invention. This embodiment of power source 120 is similar to the embodiment of power source 120 shown in FIG. 3 through FIG. 6, and FIG. 8, except that there are nine electricity generation modules 128 in power generation module 126. Power source 120 in this embodiment includes output power positive contact 122 and output power negative contact 124. In this embodiment output power positive contact 122 and output power negative contact 124 are designed to mimic the positive and negative contacts of a battery so that power source 120 can replace a battery in use. Power source 120 is packaged in this embodiment to have the same form factor, packaging, output voltage and current, and power output contacts as a traditional battery and can be used in place of a traditional battery. FIG. 11 shows several examples of electronic products which can use power source 120 as shown in FIG. 10 in place of a battery. In some embodiments power source 120 has other structural forms. Power output contacts 122 and 124 can be placed in any location on power source 120.

Power source 120 of FIG. 10 also includes temporary power input positive contact 133 and temporary power input negative contact 134. Temporary power input contacts 133 and 134 are used to provide temporary light source input power 135 for power source 120, as discussed above. In this embodiment temporary light source input power 135 is provided in the form of a one second "spark start" of electrical energy which activates power source 120 and causes power source 120 to begin generating electrical power. Once power source 120 is generating electrical power, power input contacts 133 and 134 are disconnected from the temporary power supply 132 and power input contacts 133 and 134 are no longer needed. Power source 120 will continue to generate and provide electrical power from power output contacts 122 and 124 until power source 120 is turned off. Power input contacts 133 and 134 are placed in the side near the top of power source 120 in the embodiment shown in FIG. 10. It is to be understood that power input contacts 133 and 134 can have other forms and can be placed at other locations on power source 120.

Power source 120 of FIG. 10 includes power distribution circuit 110 and power generation module 126. Power generation module 126 generates electrical power using electricity generation modules 128 as discussed above. Power distribution circuit 110 regulates, controls, and distributes the electrical power that flows into and out of power source 120. Power distribution circuit 110 accepts input power through power input contacts 133 and 134 and delivers power to power generation module 126. Power distribution circuit 110 collects the photovoltaic-generated electrical power output by power generation module 126, regulates this electrical power, and outputs the generated electrical power through output power positive contact 122 and output power negative contact 124. Power source 120 can be designed and shaped to replace many specific battery sizes and voltage and current outputs. Power source 120 can be designed to replace D size batteries, C size batteries, AA size batteries, AAA size batteries, or many other shapes and sizes of batteries. Unlike chemical batteries, power source 120 needs to be activated to begin power generation, but once activated, power source 120 can provide the voltage and current outputs of chemical storage batteries without recharging. Power source 120 can be designed to provide the voltage and current requirements of many different devices. Power source 120 can be designed to output electrical power at many different levels. In some embodiments power source 120 includes multiple power output contacts on power source 120, for use in embodiments where power source 120 is used to provide multiple voltage or current output levels.

It has been shown how power source 120 according to the invention can generate electrical power which can be used to power electrical devices. Although specific examples of materials used and mechanical and electrical configurations are given, the principles taught can be used to form many different embodiments and types of power sources 120 according to the invention. The photoluminescent and photovoltaic materials used in power source 120 can be a type which are environmentally friendly, efficient, and long-lasting, resulting in power source 120 being able to efficiently provide electrical power for many different needs. Power source 120 can be disposed of or recycled at end of life without harming the environment.

Figure 12:
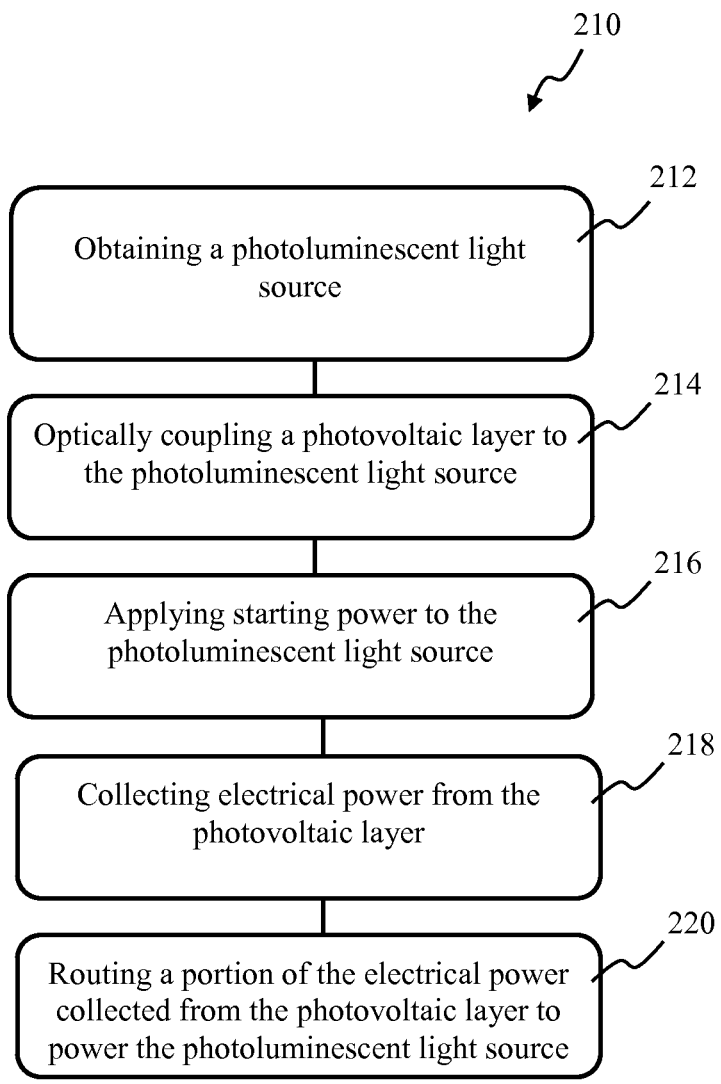
FIG. 12 illustrates method 210 of generating electrical power according to the invention.

A method of generating electrical power is disclosed and shown in FIG. 12 as method 210 of generating electrical power according to the invention. Method 210 includes step 212 obtaining a photoluminescent light source and step 214 optically coupling a photovoltaic layer to the photoluminescent light source. Method 210 according to the invention also includes step 216 applying starting power to the photoluminescent light source, step 218 collecting electrical power from the photovoltaic layer, and step 220 routing a portion of the electrical power collected from the photovoltaic layer to power the photoluminescent light source. Method 210 can include other steps. In some embodiments method 210 includes disconnecting starting power from the photoluminescent light source.

Step 212 obtaining a photoluminescent light source can include many other steps. In some embodiments step 212 obtaining a photoluminescent light source includes building a photoluminescent light source. In some embodiments step 212 according to the invention includes embedding a photoluminescent material in an optical coupling material. In some embodiments step 212 includes molding a photoluminescent material into a photoluminescent layer. In some embodiments step 212 includes embedding a light-emitting device in an optical coupling material. In some embodiments step 212 includes embedding a light-emitting device in a photoluminescent layer. In some embodiments step 212 include optically coupling a light-emitting device to a photoluminescent material. In some embodiments step 212 includes optically coupling a light-emitting device to a photoluminescent layer. In some embodiments step 212 includes embedding more than one type of photoluminescent material into an optical coupling material. In some embodiments step 212 includes molding an optical coupling material which includes one or more than one type of photoluminescent materials into a photoluminescent layer. In some embodiments step 212 includes optically stimulating a photoluminescent material with a light-emitting device. Step 212 can include placing a photoluminescent material in optical communication with a light-emitting device, such that the photoluminescent material emits light in response to receiving light from the light-emitting device.

Step 214 optically coupling a photovoltaic layer to the photoluminescent light source can include many other steps. In some embodiments step 214 includes optically bonding the light source to the photovoltaic layer. In some embodiments step 214 includes molding a portion of the photovoltaic layer into the light source. In some embodiments step 214 include optically bonding a top photovoltaic layer to the top surface of the photoluminescent light source. In some embodiments step 214 includes optically bonding a bottom photovoltaic layer to the bottom surface of the light source. In some embodiments step 214 include molding a top photovoltaic layer into the top surface of the light source. In some embodiments step 214 includes molding a bottom photovoltaic layer into the bottom surface of the light source. In some embodiments step 214 includes placing the photovoltaic layer adjacent to the photoluminescent light source such that the photovoltaic layer receives light from the light source. Step 214 can include any step which optically couples the photovoltaic layer to the photoluminescent light source such that the photovoltaic layer generates electrical power in response to receiving light from the photoluminescent light source.

Step 216 applying starting power to the photoluminescent light source can include many other steps. In some embodiments step 216 include applying a one-second duration spark start to the photoluminescent light source. In some embodiments step 216 includes applying a one-second duration of electrical power to the photoluminescent light source. In some embodiments step 216 includes applying external electrical power to the input electrical connections of the photoluminescent light source, where the photoluminescent light source emits light in response. In some embodiments step 216 includes disconnecting external electrical power from the input electrical connections of the photoluminescent light source after the photoluminescent light source begins to generate light. Step 216 can include any step involved in providing power to the photoluminescent light source, where the photoluminescent light source emits light in response to receiving the power.

Step 218 collecting electrical power from the photovoltaic layer can include many other steps. In some embodiments step 218 includes collecting electrical power from a top photovoltaic layer. In some embodiments step 218 includes collecting electrical power from a bottom photovoltaic layer. In some embodiments step 218 includes other steps.

Step 220 routing a portion of the electrical power collected from the photovoltaic layer to power the photoluminescent light source can include many other steps. In some embodiments step 220 includes routing half of the electrical power collected from the photovoltaic layer to power the photoluminescent light source. In some embodiments step 220 includes routing a portion of the electrical power collected from a top photovoltaic layer to power the photoluminescent light source. In some embodiments step 220 includes routing a portion of the electrical power collected from a bottom photovoltaic layer to power the photoluminescent light source. In some embodiments step 220 includes other steps.

Figure 13:
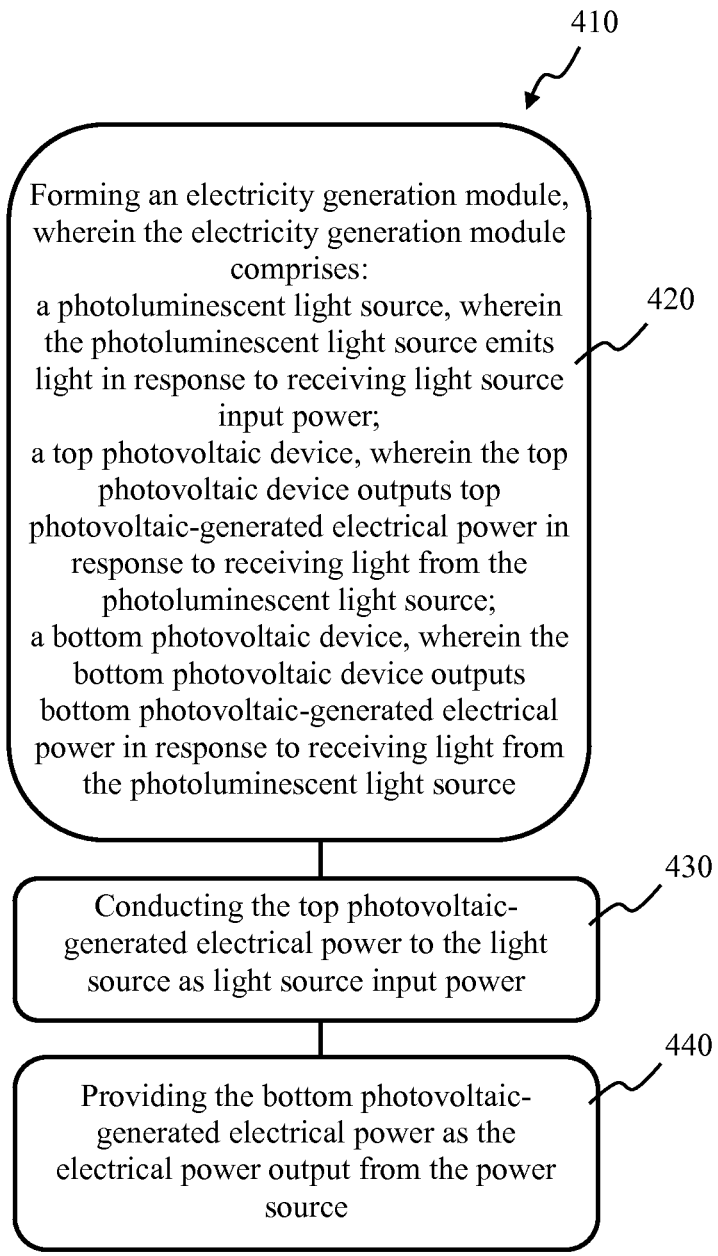
FIG. 13 illustrates method 410 of generating electrical power with a power source according to the invention.

FIG. 13 illustrates method 410 of generating electrical power with a power source according to the invention. Method 410 includes step 420 of forming an electricity generation module, where the electricity generation module includes a photoluminescent light source. The photoluminescent light source emits light in response to receiving light source input power. The electricity generation module also includes a top photovoltaic device, where the top photovoltaic device outputs top photovoltaic-generated electrical power in response to receiving light from the photoluminescent light source. The electricity generation module also includes a bottom photovoltaic device, where the bottom photovoltaic device outputs bottom photovoltaic-generated electrical power in response to receiving light from the photoluminescent light source.

Method 410 according to the invention also includes step 430 of conducting the top photovoltaic-generated electrical power to the light source as light source input power. And method 410 includes step 440 of providing the bottom photovoltaic-generated electrical power as the power source output power. Method 410 according to the invention can include many other steps.

Step 420 of forming an electricity generation module can include many other steps. In some embodiments step 420 includes the step of forming a photoluminescent light source. In some embodiments forming a photoluminescent light source includes the step of embedding a light-emitting device in a block of optical coupling material. In some embodiments forming a photoluminescent light source includes the step of embedding a photoluminescent material in a block of optical coupling material. In some embodiments the step of forming a photoluminescent light source includes the step of embedding the top photovoltaic device in the block of optical coupling material. In some embodiments the step of forming a photoluminescent light source includes the step of embedding the bottom photovoltaic device in the block of optical coupling material. In some embodiments the step of forming a photoluminescent light source includes the step of embedding a photovoltaic device in the block of optical coupling material. In some embodiment the step of forming a photoluminescent device includes the step of forming a photovoltaic device which includes a photoluminescent light source.

Step 430 of conducting the top photovoltaic-generated electrical power to the light source as light source input power can include many other steps. In some embodiments step 430 includes the step of conducting the top photovoltaic-generated electrical power to a light source power collection circuit, where the light source power collection circuit outputs collected light source power in response to receiving the top photovoltaic-generated electrical power. In some embodiments step 430 includes the step of conducting the collected light source power to a light source power distribution circuit, where the light source power distribution circuit outputs the light source input power in response to receiving the collected light source power.

Step 440 of providing the bottom photovoltaic-generated electrical power as the power source output power can include many other steps In some embodiments step 440 includes the step of conducting the bottom photovoltaic-generated electrical power to a power output circuit, wherein the power output circuit outputs the power source output power in response to receiving the bottom photovoltaic-generated electrical power.

Figure 14:
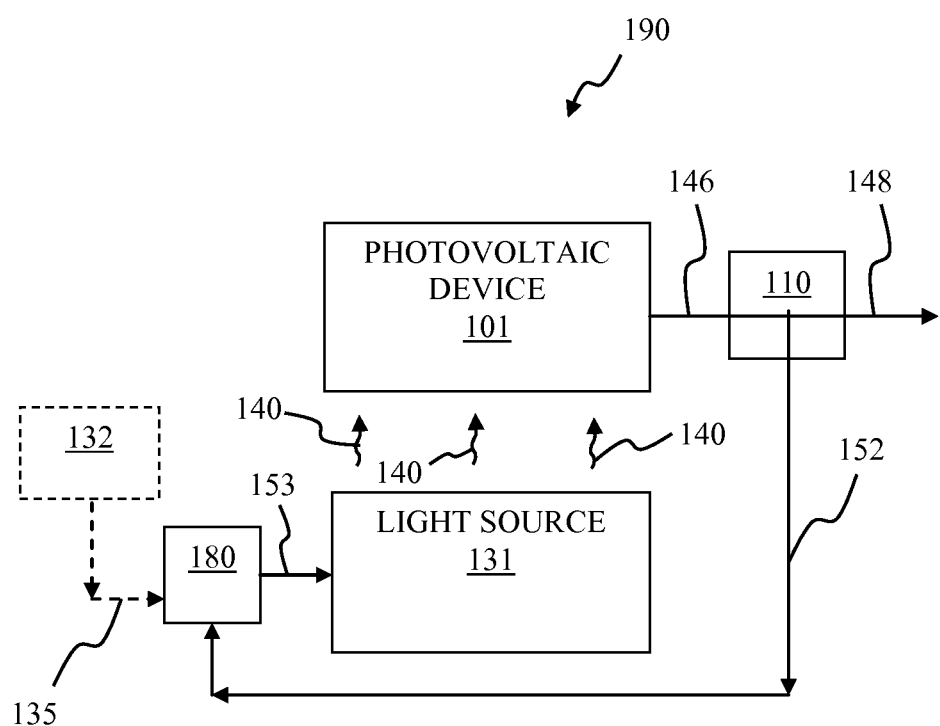
FIG. 14 shows a block diagram of an embodiment of an electronic power cell memory back-up battery 190 according to an embodiment.

Referring to FIGS. 14-24, additional embodiments, referred to as an electronic power cell memory back-up battery 190 will now be described. Referring specifically to FIG. 14, the electronic power cell memory back-up battery 190 is generally illustrated having elements similar to the embodiment of FIG. 1 discussed above. In addition, the embodiment of FIG. 14 also includes power modulating circuitry 180. As shown, power modulating circuitry 180 is electronically coupled to temporary power supply 132, power distribution circuit 110, and light source 131. Power modulating circuitry 180 (which may also be referred to as a charge-pump drive circuit) is configured to receive input power 135 from temporary power supply 132 and input power 152 from power distribution circuit 110, alter the input power to provide a periodic power supply signal 153, and provide periodic power supply signal 153 having a pre-determined period to light source 131 in order to provide power to light source 131. More specifically, power modulating circuitry 180 is configured to receive input power (152 and/or 135) and convert the input power into pulsed output power 153 of a pre-determined voltage and current, such that periodic power supply signal 153 is sometimes providing power to light source 131, and at other times is not providing power to light source 131. In an embodiment, power modulating circuitry 180 is configured to receive input power 152 and/or 135 with a voltage of approximately 3 volts DC from temporary power supply 132 and/or power distribution circuit 110, and to provide as an output to light source 131 periodic power supply signal 153 of approximately 2.7-3 volts that is pulsed such that a voltage of 2.7 to 3 volts is provided for approximately 0.5-1 second, followed by a voltage of approximately 0 for approximately 0.5-1 second (a duty cycle of approximately 50%). Although in this embodiment the duty cycle of the periodic power supply signal 153 is approximately 50%, it should be appreciated that in alternative embodiments, the duty cycle of the periodic power supply signal 153 may be some other value less than 100%. Charge pump driver circuits for converting a DC voltage into a periodic signal are generally known, may be readily constructed using transistors, capacitors, resistors and diodes, and will not be discussed in detail in this disclosure.

In operation, electronic power cell memory back-up battery 190 of FIG. 14 operates in the same manner as the embodiment of FIG. 1, with the exception that rather than providing the output 132 and/or 152 of temporary power supply 132 and/or power distribution circuit 110, respectively, (for example, a constant DC voltage) directly to light source 131, output 132 and/or 152 of temporary power supply 132 and/or power distribution circuit 110 is first provided to power modulating circuitry 180. Power modulating circuit 180 alters output 132 and/or 152 to convert it into periodic power supply signal 153 (a signal that provides a power output at certain times to light source 131, and does not provide a power output at other times to light source 131). As a result, light source 131 is not continuously receiving power from temporary power supply 132 or power distribution circuit 110. More specifically, on a periodic basis (with the period determined by power modulating circuitry 180) light source 131 receives no power from temporary power supply 132 or power distribution circuit 110. However, as a result of features of light source 131, including, for example, the very long discharge glow rate of elements of light source 131 (discussed further below), light source 131 is still able to produce light during periods in which it receives no power. In an embodiment, the period, duty cycle, and voltage characteristics of periodic power supply signal 153 are determined so as to minimize power provided by power modulating circuitry 180, based in part on the discharge glow rate of elements of light source 131. More specifically, characteristics of periodic power supply signal 153 may be selected such that power modulating circuitry 153 is providing power to light source 131 only after sufficient time has passed such that the glow of elements of light source 131 has decayed below a certain minimum level. In this manner, power is not unnecessarily consumed by the generation of periodic power supply signal 153, and may instead be provided as output power 148.

Figure 15:
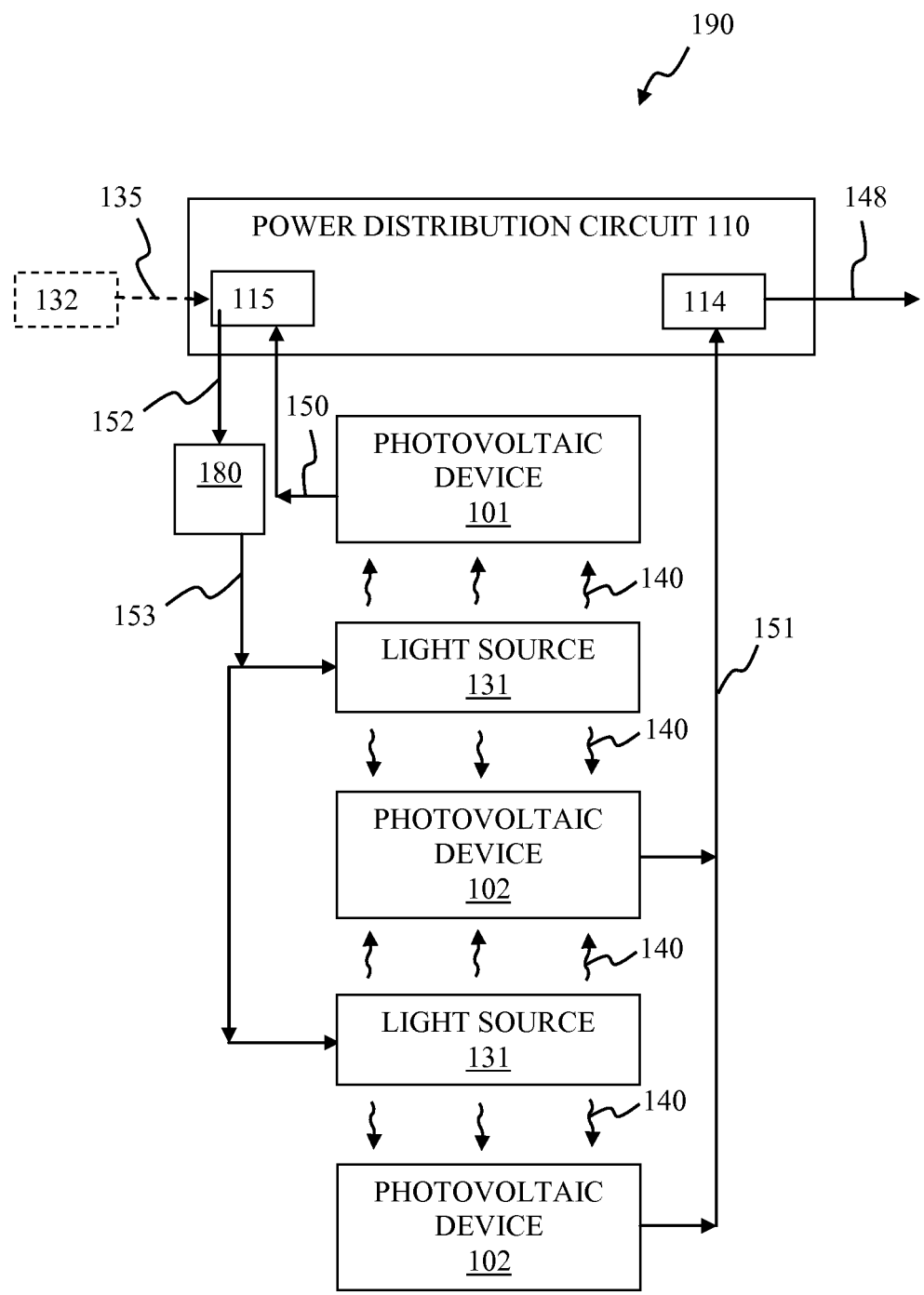
FIG. 15 shows a block diagram of an embodiment of an electronic power cell memory back-up battery 190 according to an alternative embodiment.

Referring to FIG. 15, the electronic power cell memory back-up battery 190 is generally illustrated having elements similar to the embodiment of FIG. 2 discussed above. In addition, the embodiment of FIG. 15 also includes power modulating circuitry 180. As shown, power modulating circuitry 180 is electronically coupled to light source power conditioning circuit 115 of power distribution circuit 110, and light source 131. Power modulating circuitry 180 (which may also be referred to as a charge-pump drive circuit) is configured to receive input power 152 from light source power conditioning circuit 115 of power distribution circuit 110, alter input power 152 to provide periodic power supply signal 153, and provide periodic power supply signal 153 having a pre-determined period to light source 131 to power light source 131. More specifically, power modulating circuitry 180 is configured to receive input power 152 and convert it into pulsed output power 153 of a pre-determined voltage and current, such that periodic power supply signal 153 is sometimes providing power to light source 131, and at other times is not providing power to light source 131. In an embodiment, power modulating circuitry 180 is configured to receive input power 152 with an input voltage of approximately 3 volts DC from light source power conditioning circuit 115 of power distribution circuit 110, and to provide as an output to light source 131 periodic power supply signal 153 of approximately 2.7-3 volts that is pulsed at a period of approximately 0.5-1 second and has a duty cycle of less than 100%. Charge pump driver circuits for converting a DC voltage into a periodic signal are generally known, may be readily constructed using transistors, capacitors, resistors and diodes, and will not be discussed in detail in this disclosure.

In operation, electronic power cell memory back-up battery 190 of FIG. 15 operates in the same manner as the embodiment of FIG. 2, with the exception that rather than providing the output 152 of light source power conditioning circuit 115 of power distribution circuit 110 (for example, a constant DC voltage) directly to light source 131, the output 152 of light source power conditioning circuit 115 of power distribution circuit 110 is first provided to power modulating circuitry 180. Power modulating circuit 180 alters the output to convert it into a periodic power supply signal 153 (a signal that provides a power output at certain times to light source 131, and does not provide a power output at other times to light source 131). As a result, light source 131 is not continuously receiving power from light source power conditioning circuit 115 of power distribution circuit 110. More specifically, on a periodic basis (with the period and other characteristics of periodic power supply signal 153 determined by power modulating circuitry 180 as discussed above with respect to FIG. 14) light source 131 receives no power from light source power conditioning circuit 115 of power distribution circuit 110. However, as discussed above with respect to FIG. 14, light source 131 is still able to produce light during periods in which it receives no power.

Figure 16:
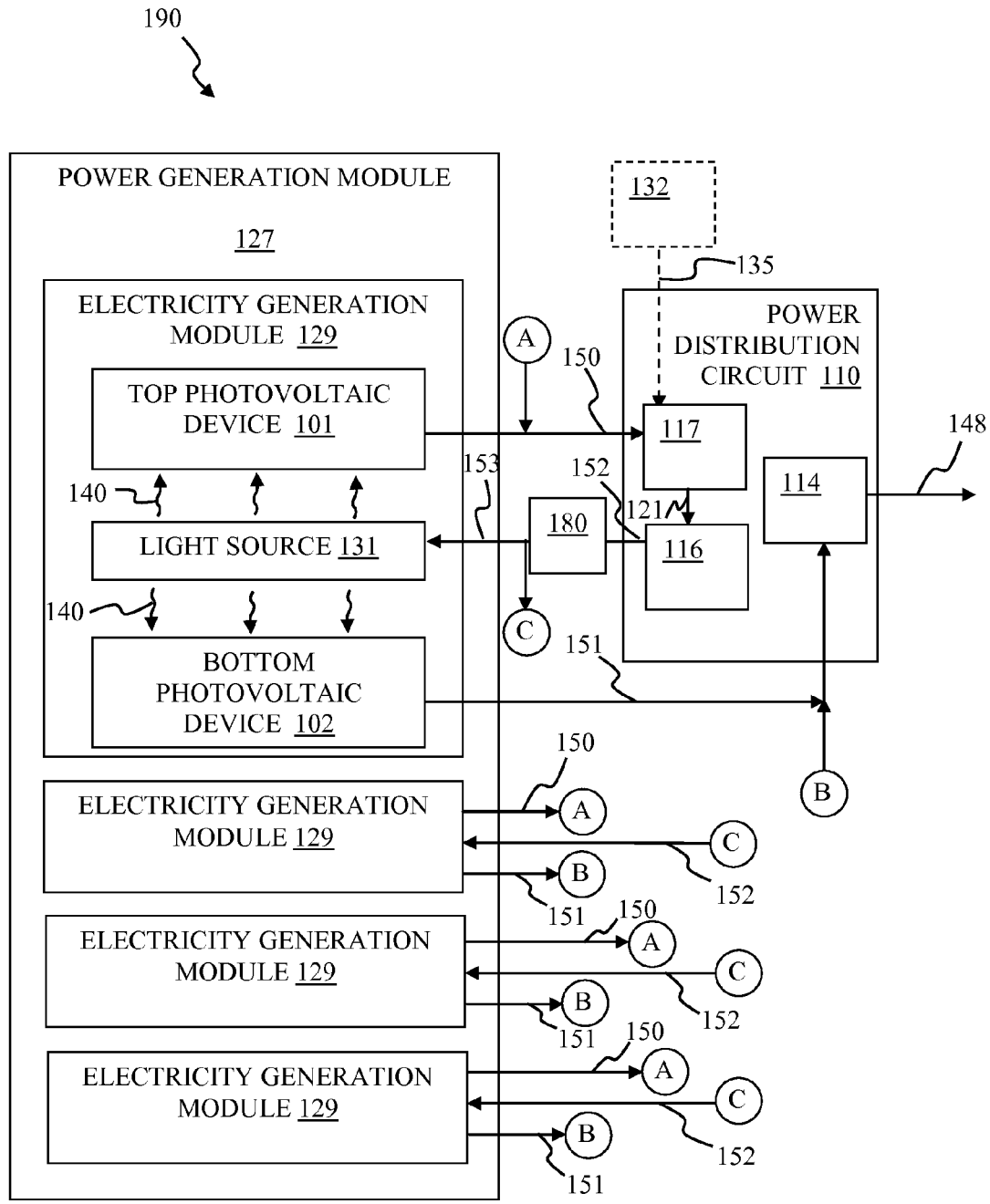
FIG. 16 shows a block diagram of an embodiment of an electronic power cell memory back-up battery 190 according to an alternative embodiment.

Referring to FIG. 16, the electronic power cell memory back-up battery 190 is generally illustrated having elements similar to the embodiment of FIG. 3 discussed above. In addition, the embodiment of FIG. 16 also includes power modulating circuitry 180. As shown, power modulating circuitry 180 is electronically coupled to light source power distribution circuit 116 of power distribution circuit 110, and multiple light sources 131. Power modulating circuitry 180 (which may also be referred to as a charge-pump drive circuit) is configured to receive input power 152 from light source power distribution circuit 116 of power distribution circuit 110, alter the input power to provide periodic power supply signal 153, and provide periodic power supply signal 153 having a pre-determined period to light sources 131 to power light sources 131. More specifically, power modulating circuitry 180 is configured to receive input power 152 and convert it into pulsed output power 153 of a pre-determined voltage and current, such that the periodic power supply signal is sometimes providing power to light sources 131, and at other times is not providing power to light sources 131. In an embodiment, power modulating circuitry 180 is configured to receive power supply input 152 of approximately 3 volts DC from light source power distribution circuit 116 of power distribution circuit 110, and to provide as an output to light sources 131 periodic power supply signal 153 of approximately 2.7-3 volts that is pulsed at a period of approximately 0.5-1 second and a duty cycle of less than 100%.

In operation, electronic power cell memory back-up battery 190 of FIG. 16 operates in the same manner as the embodiment of FIG. 3, with the exception that rather than providing the output 152 of light source power distribution circuit 116 of power distribution circuit 110 (for example, a constant DC voltage) directly to light sources 131, the output 152 of light source power distribution circuit 116 of power distribution circuit 110 is first provided to power modulating circuitry 180. Power modulating circuit 180 alters power signal 152 to convert it into periodic power supply signal 153 (a signal that provides a power output at certain times to light sources 131, and does not provide a power output at other times to light sources 131). As a result, light sources 131 are not continuously receiving power 153 from light source power distribution circuit 116 of power distribution circuit 110. More specifically, on a periodic basis (with the period determined by power modulating circuitry 180) light sources 131 receive no power from light source power distribution circuit 116 of power distribution circuit 110. However, as has been discussed previously, light sources 131 are still able to produce light during periods in which they receive no power.

Figure 17:
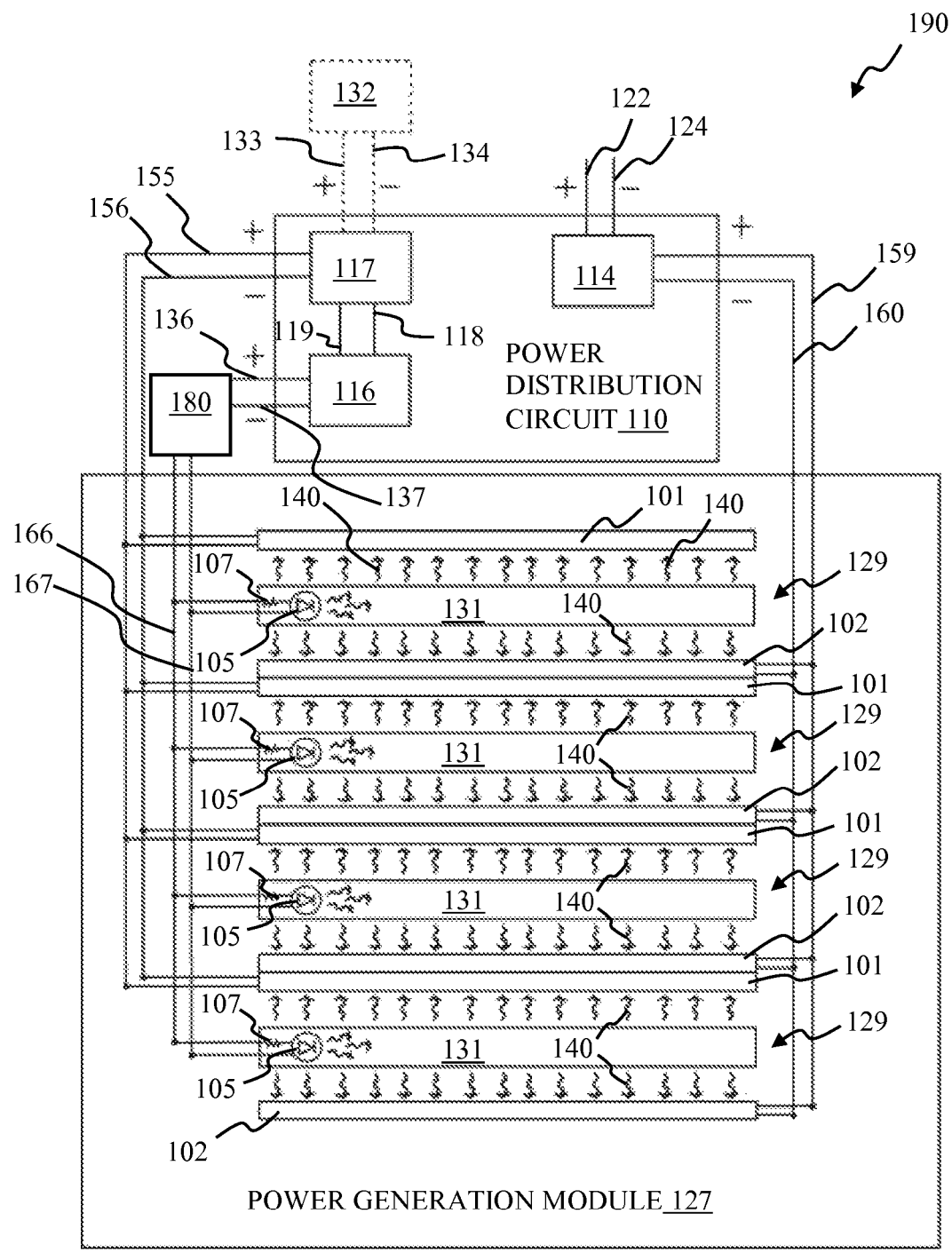
FIG. 17 shows a simplified schematic diagram of an electronic power cell memory back-up battery 190 of FIG. 16.

Referring to FIG. 17, the electronic power cell memory back-up battery 190 is generally illustrated having elements similar to the embodiment of FIG. 4 discussed above. In addition, the embodiment of FIG. 17 also includes power modulating circuitry 180. As shown, power modulating circuitry 180 is electronically coupled to light source power distribution circuit 116 of power distribution circuit 110 via light source power electrical connections 136 and 137. Power modulating circuitry 180 is connected to light sources 131 via connections 166 and 167.

Figure 18:
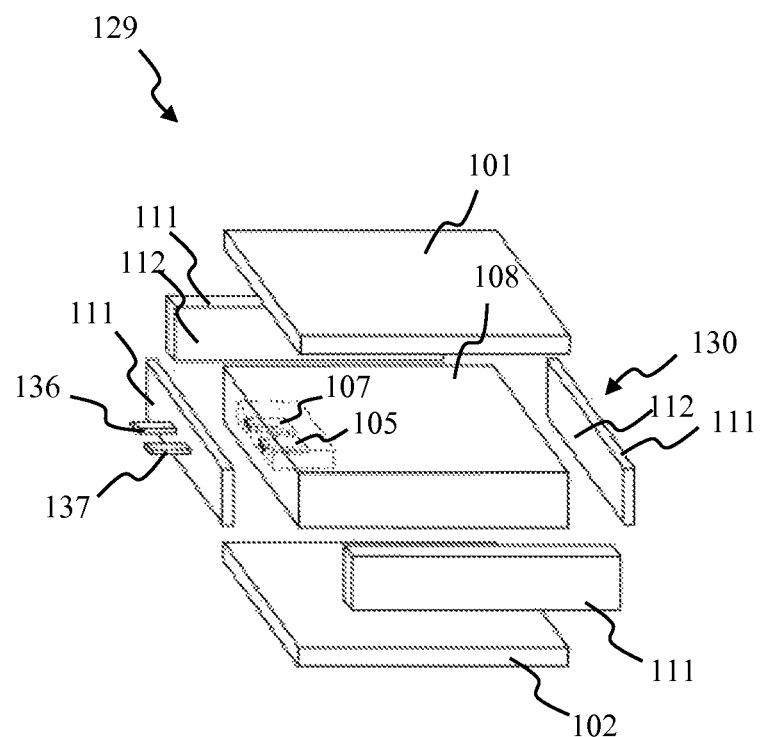
FIG. 18 shows an exploded perspective view of electricity generation module 129 of electronic power cell memory back-up battery 190 of FIG. 16.
Figure 19:
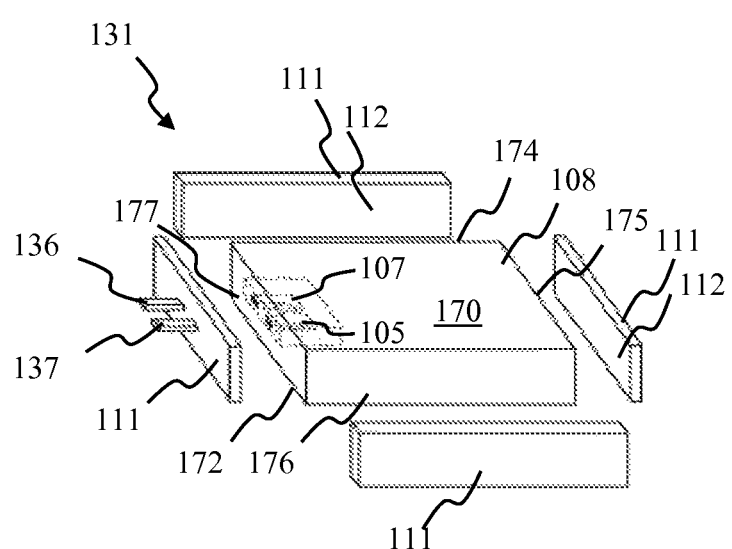
FIG. 19 shows an exploded perspective view of light source 131 of electricity generation module 129 of FIG. 18.
Figure 20:
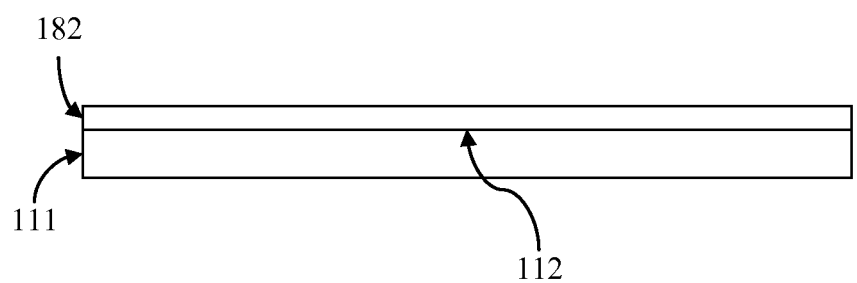
FIG. 20 shows a top view cross-section of an element 111 of an embodiment of light source 131 of FIG. 19 according to an alternative embodiment.

Referring to FIGS. 18 and 19, electricity generation module 129 and light source 131 are generally illustrated having elements similar to the electricity generation module 128 and light source 130 of FIGS. 5 and 6, respectively, discussed above. In addition, the embodiments of FIGS. 18 and 19 specifically call out interior surfaces 112 of mirrors 111. Interior surfaces 112 of mirrors 111 are the surfaces of mirrors 111 that are facing the light emitting device 105. Interior surfaces 112 of mirrors 111 are coated with a Light Photon Releaser (LPR) 182 (the coating is not shown in FIGS. 18 and 19, but is shown in FIG. 20, a close-up top view of a mirror 111). Light Photon Releaser 182 comprises an optical compound doped with phosphorous, Europium, and various earth elements, such as, for example, elements from the Lanthanide series. The LPR comprises stored light photons that are subsequently released by light emitted from a light-emitting device, such as, for example, light emitting device 105. In an embodiment, the LPR material has the capability of becoming fully charged (storing of photons) in a very short time period (for example, within 5 minutes), but has the capability of a very long discharge glow rate (for example, 10-12 hours of emitting photons).

In operation, electricity generation module 129 and light source 131 of FIGS. 18-20 operates in the same manner as electricity generation module 128 and light source 130 of FIGS. 5 and 6, respectively, with the exception that the LPR coating 182 on mirrors 111 provides an additional source of photons available for the light source 131. These additional photons may be released when light from a light-emitting device, such as, for example, light emitting device 105, strikes the LPR coated surfaces of mirrors 111. These additional photons help enable the electronic power cell memory back-up battery 190 to continue to provide energy even when light emitting device 105 of light source 131 is not emitting light (such as, for example, when no power is being provided to light source 131 via power modulating circuitry 180).

Figure 21:
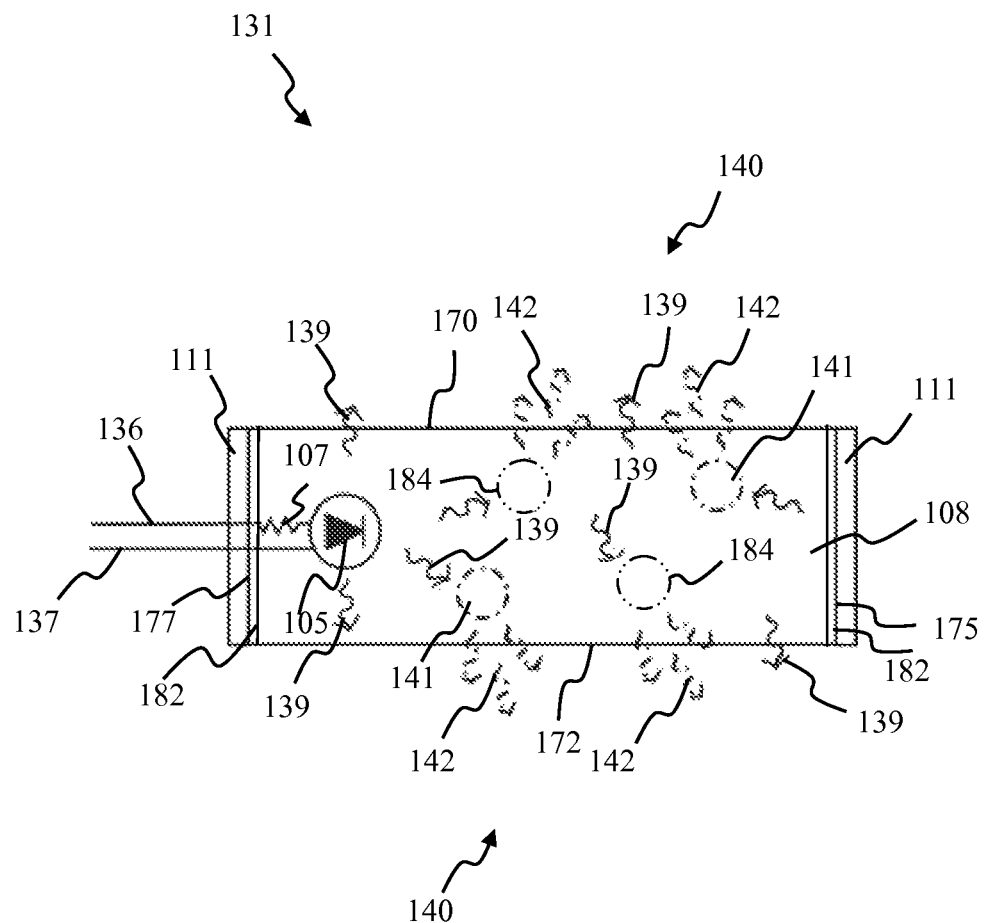
FIG. 21 shows a side view cross-section of an embodiment of light source 131 of FIG. 19.

FIG. 21 shows a side view cross-section of an embodiment of light source 131 of FIG. 19. Referring to FIG. 21, light source 131 is generally illustrated having elements similar to the embodiment of light source 130 of FIG. 7 discussed above. In addition, the embodiment of FIG. 21 also generally illustrates mirrors 111 having LPR 182 coating their inner surfaces (and functioning as discussed above with respect to FIGS. 18-20). The embodiment of FIG. 21 further includes LPR 184 embedded in optical coupling material 108. Embedding LPR 184 in optical coupling material 108 places LPR 184 in optical communication with both light-emitting device 105 and photovoltaic devices 101 and 102. In this embodiment LPR 184 comprises an optical compound doped with phosphorous, Europium, and various earth elements, such as, for example, elements from the Lanthanide series. The LPR 184 comprises stored light photons that are subsequently released by absorbing photons from light emitted from a light-emitting device, such as, for example, light emitting device 105. LPR 184 emits more than one photon for each photon it absorbs. In this way LPR 184 performs optical amplification. Light 139 that hits LPR 184 embedded in optical coupling material 108 causes light 142 to be emitted by LPR 184. Light 142 emitted by LPR 184 travels through optical coupling material 108 until light 142 exits either top surface 170 or bottom surface 172. In this way light 142 becomes part of light 140 emitted from light source 131. In this way light 142 becomes part of light 140 impinging on photovoltaic devices 101 and/or 102. It should be appreciated that in the same manner, light is emitted by LPR 182 coating the surfaces of mirrors 111, and that the light emitted by LPR 182 also becomes part of light 140 emitted from light source 131 and impinging on photovoltaic devices 101 and/or 102.

Figure 22:
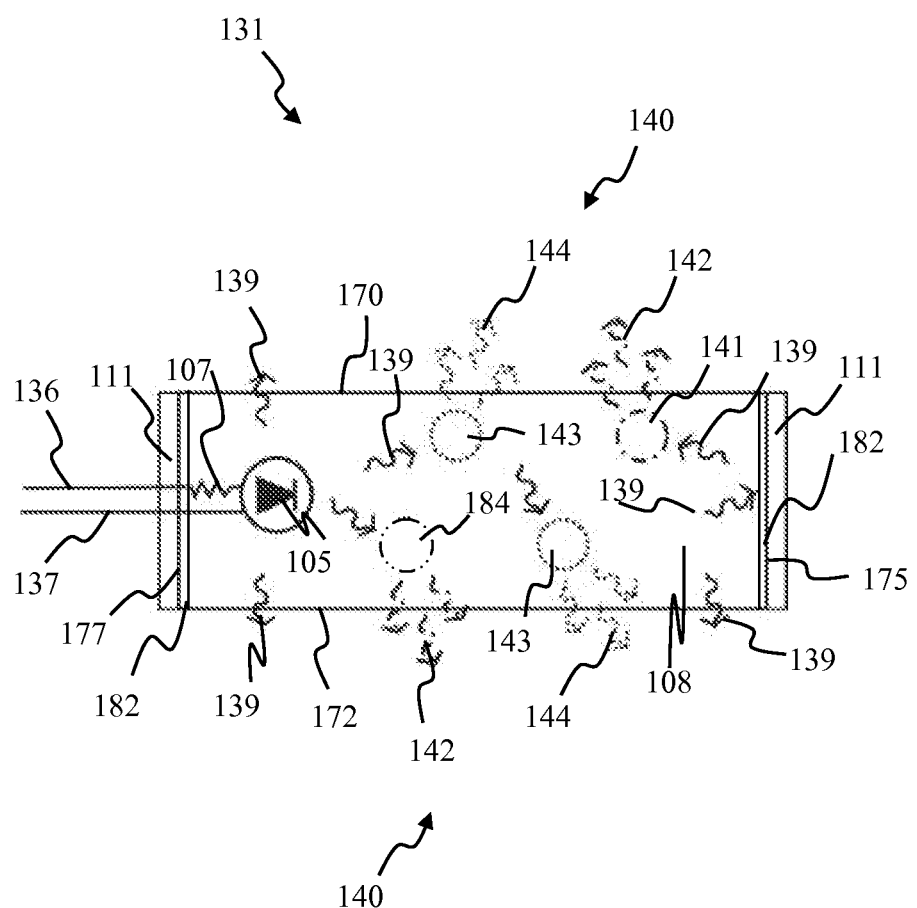
FIG. 22 shows a side view cross-section of a further embodiment of light source 131 of FIG. 19.

FIG. 22 shows a side view cross-section of an embodiment of light source 131 of FIG. 19. Referring to FIG. 22, light source 131 is generally illustrated having elements similar to the embodiment of light source 130 of FIG. 8 discussed above. In addition, the embodiment of FIG. 22 also generally illustrates mirrors 111 having LPR 182 coating their inner surfaces (and functioning as discussed above with respect to FIGS. 18-20). The embodiment of FIG. 22 further includes LPR 184 embedded in optical coupling material 108. Embedding LPR 184 in optical coupling material 108 places LPR 184 in optical communication with both light-emitting device 105 and photovoltaic devices 101 and 102. In this embodiment LPR 184 comprises an optical compound doped with phosphorous, Europium, and various earth elements, such as, for example, elements from the Lanthanide series. The LPR 184 comprises stored light photons that are subsequently released by absorbing photons from light emitted from a light-emitting device, such as, for example, light emitting device 105. LPR 184 emits more than one photon for each photon it absorbs. In this way LPR 184 performs optical amplification. Light 139 that hits LPR 184 embedded in optical coupling material 108 causes light 142 to be emitted by LPR 184. Light 142 emitted by LPR 184 travels through optical coupling material 108 until light 142 exits either top surface 170 or bottom surface 172. In this way light 142 becomes part of light 140 emitted from light source 131. In this way light 142 becomes part of light 140 impinging on photovoltaic devices 101 and/or 102. It should be appreciated that in the same manner, light is emitted by LPR 182 coating the surfaces of mirrors 111, and that the light emitted by LPR 182 also becomes part of light 140 emitted from light source 131 and impinging on photovoltaic devices 101 and/or 102. In an embodiment, light emitting device 105, light photon releaser 182, embedded light photon releaser 184, and/or other photoluminescent materials in light source 131 are configured to have the same or very similar wavelength. For example, in one embodiment, light emitting device 105 is configured to emit light having a wavelength of 450 nm, and light photon releaser 182, embedded light photon releaser 184, and other photoluminescent materials in light source 131 are configured to also emit light at 450 nm.

Figure 23:
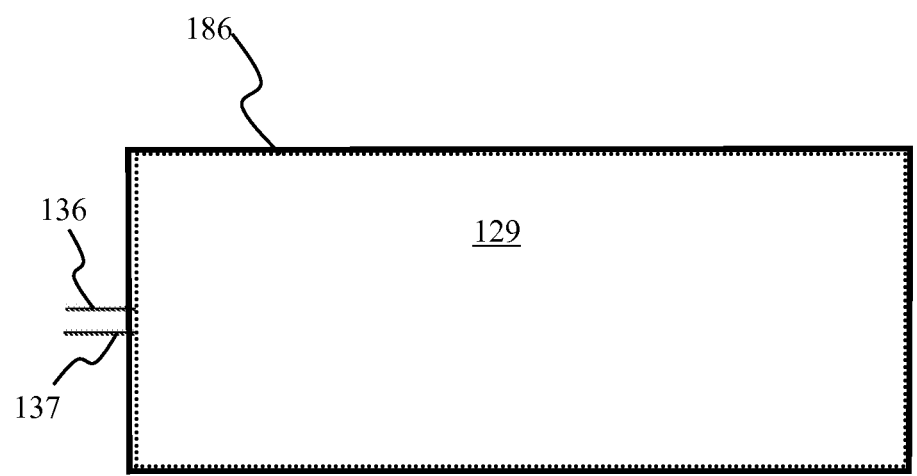
FIG. 23 shows a side view of an additional embodiment of electricity generation module 129 of FIG. 18.

FIG. 23 generally illustrates a side view of electricity generation module 129 of FIG. 18. FIG. 23 shows that the exterior surfaces of the electricity generation module 129 are coated with a reflective coating 186. In this embodiment, the entire outside surface of electricity generation module 129 is covered with a reflective coating 186, such that the only uncoated surfaces are electrical connections 136 and 137. In some embodiments, the reflective coating 186 is a sprayed-on mirror-type reflective material. Reflective coating 186 serves to increase the efficiency of the device by preventing light and photons from leaking external to the device.

Figure 24:
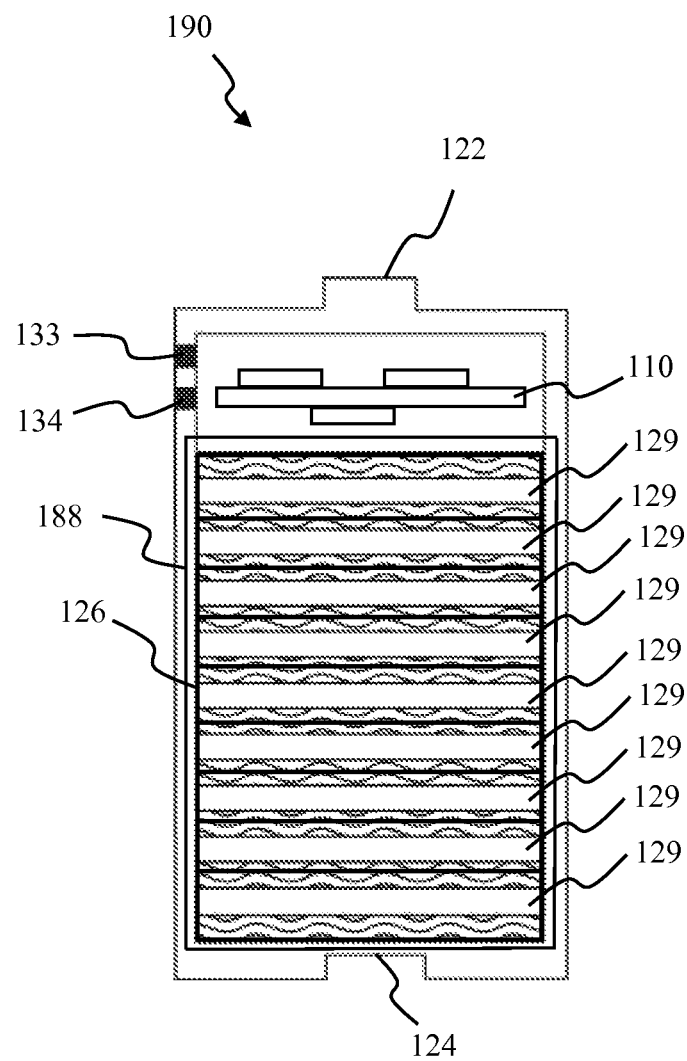
FIG. 24 shows a side view cross-section of an embodiment of electronic power cell memory back-up battery 190.

FIG. 24 shows a side view cross-section of an embodiment of power source 120 with a form factor of a chemical storage battery. The embodiment of FIG. 24 is the same as that of the embodiment of FIG. 10, with the exception that in the embodiment of FIG. 24, the exterior surfaces of the electricity generation modules 129 are coated with a reflective coating 188. In an embodiment, the reflective coating 188 is a sprayed-on mirror-type reflective material. Reflective coating 188 serves to increase the efficiency of the device by preventing light and photons from leaking external to electricity generation modules 129.

Figure 25:
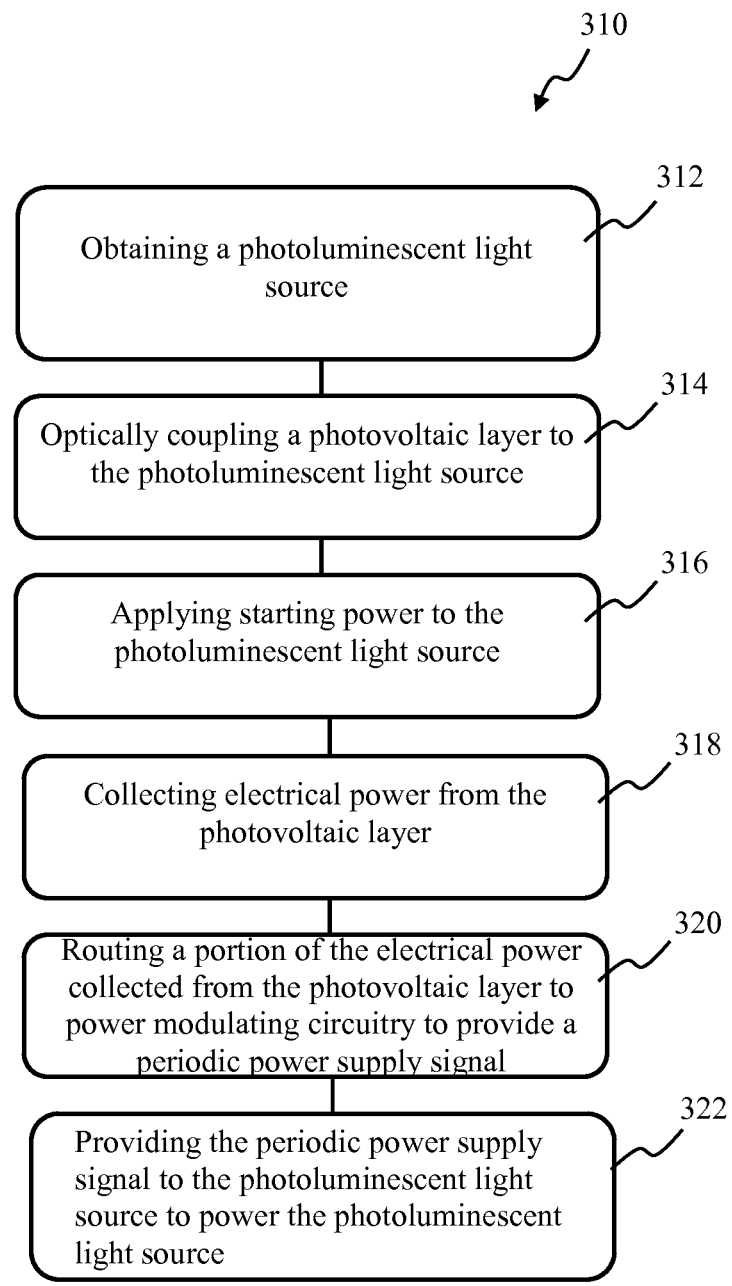
FIG. 25 illustrates method 310 of generating electrical power according to the invention.

A method of generating electrical power is disclosed and shown in FIG. 25 as method 310 of generating electrical power according to the invention. Method 310 includes step 312 obtaining a photoluminescent light source and step 314 optically coupling a photovoltaic layer to the photoluminescent light source. Method 310 according to the invention also includes step 316 applying starting power to the photoluminescent light source, step 318 collecting electrical power from the photovoltaic layer, step 320 routing a portion of the electrical power collected from the photovoltaic layer to power modulating circuitry to provide a periodic power supply signal, and step 322, providing the periodic power supply signal to the photoluminescent light source to power the photoluminescent light source. Method 310 can include other steps. In some embodiments method 310 includes disconnecting starting power from the photoluminescent light source.

Step 312 obtaining a photoluminescent light source comprising LPR can include many other steps. In some embodiments step 312 obtaining a photoluminescent light source includes building a photoluminescent light source. In some embodiments step 312 according to the invention includes embedding a photoluminescent material in an optical coupling material. In some embodiments step 312 includes molding a photoluminescent material into a photoluminescent layer. In some embodiments step 312 includes embedding a light-emitting device in an optical coupling material. In some embodiments step 312 includes embedding a light-emitting device in a photoluminescent layer. In some embodiments step 312 include optically coupling a light-emitting device to a photoluminescent material. In some embodiments step 312 includes optically coupling a light-emitting device to a photoluminescent layer. In some embodiments step 312 includes embedding more than one type of photoluminescent material into an optical coupling material. In some embodiments step 312 includes molding an optical coupling material which includes one or more than one type of photoluminescent materials into a photoluminescent layer. In some embodiments step 312 includes optically stimulating a photoluminescent material with a light-emitting device. Step 312 can include placing a photoluminescent material in optical communication with a light-emitting device, such that the photoluminescent material emits light in response to receiving light from the light-emitting device.

Step 314 optically coupling a photovoltaic layer to the photoluminescent light source can include many other steps. In some embodiments step 314 includes optically bonding the light source to the photovoltaic layer. In some embodiments step 314 includes molding a portion of the photovoltaic layer into the light source. In some embodiments step 314 include optically bonding a top photovoltaic layer to the top surface of the photoluminescent light source. In some embodiments step 314 includes optically bonding a bottom photovoltaic layer to the bottom surface of the light source. In some embodiments step 314 include molding a top photovoltaic layer into the top surface of the light source. In some embodiments step 314 includes molding a bottom photovoltaic layer into the bottom surface of the light source. In some embodiments step 314 includes placing the photovoltaic layer adjacent to the photoluminescent light source such that the photovoltaic layer receives light from the light source. Step 314 can include any step which optically couples the photovoltaic layer to the photoluminescent light source such that the photovoltaic layer generates electrical power in response to receiving light from the photoluminescent light source.

Step 316 applying starting power to the photoluminescent light source can include many other steps. In some embodiments step 316 include applying a one-second duration spark start to the photoluminescent light source. In some embodiments step 316 includes applying a one-second duration of electrical power to the photoluminescent light source. In some embodiments step 316 includes applying external electrical power to the input electrical connections of the photoluminescent light source, where the photoluminescent light source emits light in response. In some embodiments step 316 includes disconnecting external electrical power from the input electrical connections of the photoluminescent light source after the photoluminescent light source begins to generate light. Step 316 can include any step involved in providing power to the photoluminescent light source, where the photoluminescent light source emits light in response to receiving the power.

Step 318 collecting electrical power from the photovoltaic layer can include many other steps. In some embodiments step 318 includes collecting electrical power from a top photovoltaic layer. In some embodiments step 318 includes collecting electrical power from a bottom photovoltaic layer. In some embodiments step 318 includes other steps.

Step 320, routing a portion of the electrical power collected from the photovoltaic layer to power modulating circuitry to provide a periodic power supply signal, can include many other steps. In some embodiments step 320 includes routing a portion of the electrical power to charge pump circuitry configured to provide a periodic power supply signal that does not provide power when the photoluminescent light source is emitting light. In some embodiments step 320 includes routing a portion of the electrical power to charge pump circuitry configured to provide a periodic power supply signal that minimizes provided power when the photoluminescent light source is emitting light. In some embodiments step 320 includes routing a portion of the electrical power to charge pump circuitry configured to provide a periodic power supply signal with a period related to the duration during which LPR material will emit photons. In some embodiments step 320 includes other steps. In step 322, the periodic power supply signal is provided to the photoluminescent light source to power the photoluminescent light source.

Figure 26:
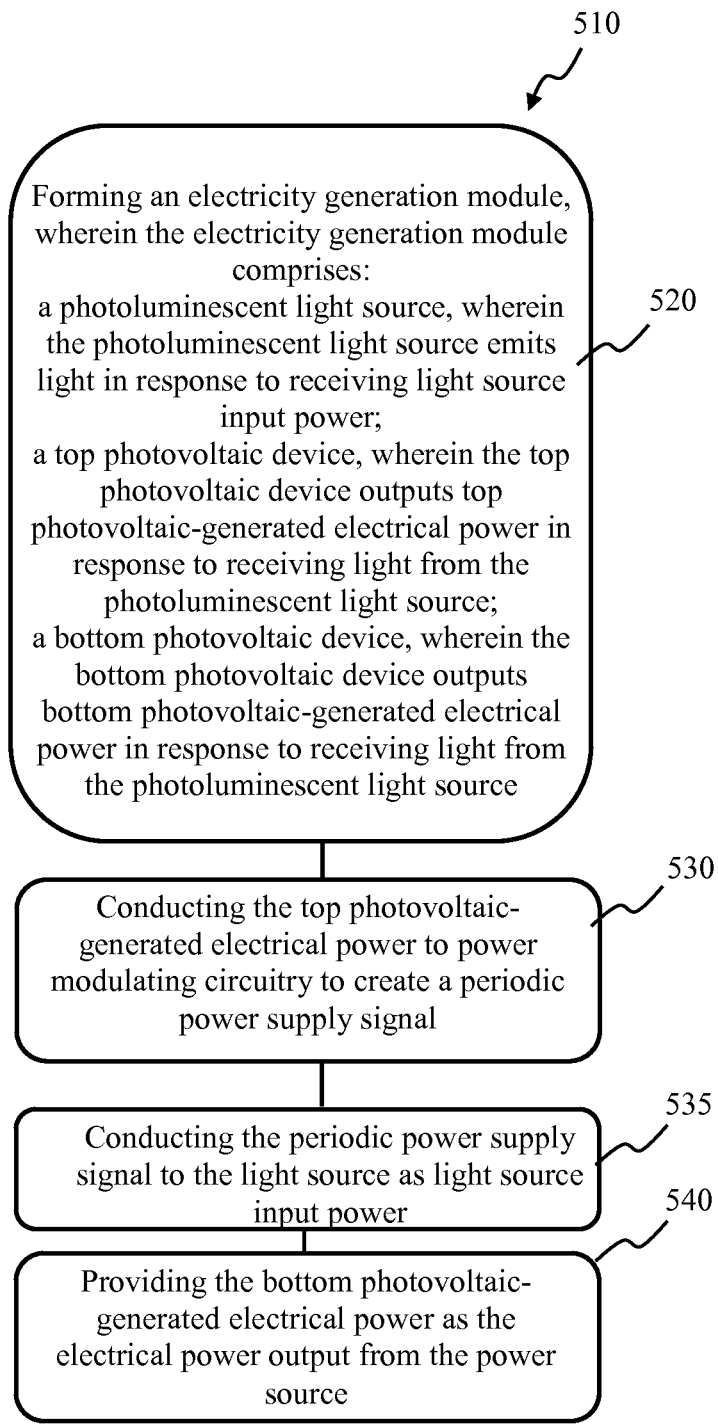
FIG. 26 illustrates method 510 of generating electrical power with a power source according to the invention.

FIG. 26 illustrates method 510 of generating electrical power with a power source according to the invention. Method 510 includes step 520 of forming an electricity generation module, where the electricity generation module includes a photoluminescent light source. The photoluminescent light source emits light in response to receiving light source input power. The electricity generation module also includes a top photovoltaic device, where the top photovoltaic device outputs top photovoltaic-generated electrical power in response to receiving light from the photoluminescent light source. The electricity generation module also includes a bottom photovoltaic device, where the bottom photovoltaic device outputs bottom photovoltaic-generated electrical power in response to receiving light from the photoluminescent light source.

Method 510 according to the invention also includes step 530 of conducting the top photovoltaic-generated electrical power to power modulating circuitry to create a periodic power supply signal. Method 510 also includes the step 535 of conducting the periodic power supply signal to the light source as light source input power. Method 510 further includes step 540 of providing the bottom photovoltaic-generated electrical power as the power source output power. Method 510 according to the invention can include many other steps.

Step 520 of forming an electricity generation module can include many other steps. In some embodiments step 520 includes the step of forming a photoluminescent light source comprising LPR. In some embodiments forming a photoluminescent light source includes the step of embedding a light-emitting device in a block of optical coupling material. In some embodiments forming a photoluminescent light source includes the step of embedding a photoluminescent material in a block of optical coupling material. In some embodiments the step of forming a photoluminescent light source includes the step of embedding the top photovoltaic device in the block of optical coupling material. In some embodiments the step of forming a photoluminescent light source includes the step of embedding the bottom photovoltaic device in the block of optical coupling material. In some embodiments the step of forming a photoluminescent light source includes the step of embedding a photovoltaic device in the block of optical coupling material. In some embodiment the step of forming a photoluminescent device includes the step of forming a photovoltaic device which includes a photoluminescent light source.

Step 530, conducting the top photovoltaic-generated electrical power to power modulating circuitry to create a periodic power supply signal can include many other steps. In some embodiments step 530 includes conducting the top photovoltaic-generated electrical power to charge pump circuitry configured to provide a periodic power supply signal that does not provide power when the photoluminescent light source is emitting light. In some embodiments step 530 includes conducting the top photovoltaic-generated electrical power to charge pump circuitry configured to provide a periodic power supply signal that minimizes provided power when the photoluminescent light source is emitting light. In some embodiments step 530 includes conducting the top photovoltaic-generated electrical power to charge pump circuitry configured to provide a periodic power supply signal with a period related to the duration during which LPR material will emit photons. In some embodiments step 530 may include other steps.

In step 535, the periodic power supply signal is conducted to the light source as light source input power can include many other steps. Step 540 of providing the bottom photovoltaic-generated electrical power as the power source output power can include many other steps. In some embodiments step 540 includes the step of conducting the bottom photovoltaic-generated electrical power to a power output circuit, wherein the power output circuit outputs the power source output power in response to receiving the bottom photovoltaic-generated electrical power.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims. For example, the photovoltaic devices and photoluminescent light sources can be sized large enough to generate power for homes and businesses, or can be sized small enough to reside in a semiconductor device.

The invention claimed is:

1. A method of generating electrical power with an electronic power cell memory back-up battery, the method comprising:
  forming an electricity generation module, wherein the electricity generation module comprises:
    a photoluminescent light source comprising a photoluminescent material embedded throughout a block of optical coupling material and a light-emitting device embedded in the block of optical coupling material, wherein the photoluminescent light source emits light in response to the light-emitting device receiving light source input, wherein forming the photoluminescent light source comprises embedding a light-emitting device, and wherein the light emitting device receives the light source input;
    a top photovoltaic device, wherein the top photovoltaic device outputs top photovoltaic-generated electrical power in response to receiving light from the photoluminescent light source; a mirror on a side of the photoluminescent light source, wherein the surface of the mirror facing the luminescent light source is coated with a Light Photon Releaser (LPR), wherein the LPR comprises a compound that absorbs light received from the light-emitting device, that compound doped with phosphorus, europium, and/or elements from the Lanthanide series;
    a bottom photovoltaic device, wherein the bottom photovoltaic device outputs
      bottom photovoltaic-generated electrical power in response to receiving light from the photoluminescent light source;
      power modulation circuitry electronically coupled to the photoluminescent light source and top photovoltaic device;
  conducting the top photovoltaic-generated electrical power to the power modulation circuitry;

altering the top photovoltaic-generated electrical power in the power modulation circuitry to provide a periodic power supply signal;

conducting the periodic power supply signal to the photoluminescent light source as light source input power; and providing the bottom photovoltaic-generated electrical power as the power source output power, wherein the light emitted from the photoluminescent light source does not pass through an air gap before being received by the top photovoltaic device, the bottom photovoltaic device, and the LPR coating on the mirror, wherein the light emitted does not have to pass through an air gap.

2. The method of claim 1, wherein forming the photoluminescent light source further comprises further embedding the light photon releaser (LPR) material in the block of optical coupling material.

3. The method of claim 1, wherein providing the bottom photovoltaic-generated electrical power as the power source output power comprises conducting the bottom photovoltaic-generated electrical power to a power output circuit, wherein the power output circuit outputs the power source output power in response to receiving the bottom photovoltaic-generated electrical power.

4. The method of claim 1, wherein the photoluminescent material is optically coupled to the top photovoltaic device and the bottom photovoltaic device.

5. The method of claim 1, wherein the photoluminescent material comprises green phosphor material.

6. The method of claim 1, wherein the photoluminescent light source comprises more than one photoluminescent material.

* * * * *

UNITED STATES PATENT AND TRADEMARK OFFICE
CERTIFICATE OF CORRECTION

| | | |
|---|---|---|
| PATENT NO. | : 9,647,162 B2 | Page 1 of 1 |
| APPLICATION NO. | : 14/682995 | |
| DATED | : May 9, 2017 | |
| INVENTOR(S) | : Michael Jon Hodges | |

It is certified that error appears in the above-identified patent and that said Letters Patent is hereby corrected as shown below:

In the Claims

In Claim 2, Column 35, Line 15:
"…light source further comprises further embedding…"

Should read:
"…light source further comprises embedding…"

Signed and Sealed this
Eighteenth Day of July, 2017

Joseph Matal
*Performing the Functions and Duties of the*
*Under Secretary of Commerce for Intellectual Property and*
*Director of the United States Patent and Trademark Office*